United States Patent
Kim et al.

(10) Patent No.: US 11,616,102 B2
(45) Date of Patent: Mar. 28, 2023

(54) DISPLAY DEVICE AND FABRICATING METHOD THEREOF

(71) Applicant: Samsung Display Co., Ltd., Yongin-si (KR)

(72) Inventors: Hyun Young Kim, Yongin-si (KR); Jong Ryuk Park, Yongin-si (KR); Ji Youn Lee, Yongin-si (KR); Kwang Sik Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 122 days.

(21) Appl. No.: 17/167,431

(22) Filed: Feb. 4, 2021

(65) Prior Publication Data

US 2021/0242284 A1    Aug. 5, 2021

(30) Foreign Application Priority Data

Feb. 4, 2020   (KR) ........................ 10-2020-0013360

(51) Int. Cl.
*G06F 3/041* (2006.01)
*G06F 3/044* (2006.01)
(Continued)

(52) U.S. Cl.
CPC .......... *H01L 27/323* (2013.01); *G06F 3/0445* (2019.05); *G06F 3/0446* (2019.05);
(Continued)

(58) Field of Classification Search
CPC .... G06F 3/0446; G06F 3/0412; G06F 3/0443; G06F 3/0445; G06F 2203/04103; G06F 2203/04112; G06F 3/04164; G06F 2203/04111; G06F 3/047; G06F 3/041; G06F 2203/04107; G06F 3/04144; G06F 3/044; H05K 1/115; H05K 2201/09481; H05K 2201/09372; H05K 1/0266;
(Continued)

(56) References Cited

U.S. PATENT DOCUMENTS 8,895,970 B2 * 11/2014 Kim ...................... H01L 27/124
                                                           257/E51.019
8,988,627 B2 * 3/2015 Tae ......................... H01L 22/32
                                                                  349/54
(Continued)

FOREIGN PATENT DOCUMENTS

KR    10-1866395    6/2018
KR    10-2019-0025096    3/2019

*Primary Examiner* — Dismery Mercedes
(74) *Attorney, Agent, or Firm* — H.C. Park & Associates, PLC

(57) ABSTRACT

Provided is a display device that includes a substrate including a plurality of pixels; a display element layer including a light emitting element provided in each of the pixels; and a touch sensor on the display element layer. The touch sensor may include: a base layer on the display element layer; a first conductive pattern on the base layer; a first insulating layer provided over the first conductive pattern; a second conductive pattern on the first insulating layer; a second insulating layer provided over the second conductive pattern; an intermediate layer on the base layer; and a cover layer provided over the intermediate layer. The intermediate layer and the cover layer may include different materials.

19 Claims, 27 Drawing Sheets

(51) Int. Cl.
*H01L 27/32* (2006.01)
*G09G 3/00* (2006.01)
*H01L 51/56* (2006.01)

(52) U.S. Cl.
CPC ......... *G09G 3/006* (2013.01); *H01L 27/3246* (2013.01); *H01L 27/3258* (2013.01); *H01L 27/3276* (2013.01); *H01L 51/56* (2013.01); *G06F 2203/04103* (2013.01); *G06F 2203/04111* (2013.01); *G09G 2330/12* (2013.01); *H01L 2227/323* (2013.01); *H05K 2201/09372* (2013.01)

(58) Field of Classification Search
CPC .. H05K 1/0268; H05K 1/117; H01L 27/3276; H01L 27/323; H01L 27/3246; H01L 27/3258; G09G 3/006; G09G 2300/0426; G09G 2330/12; G09G 2330/10; G09G 3/3208; G09G 3/32; G09G 3/3225; G09G 3/3648; G09G 2330/08
See application file for complete search history.

(56) References Cited

U.S. PATENT DOCUMENTS

| | | | |
|---|---|---|---|
| 10,340,317 | B2 | 7/2019 | Oh et al. |
| 10,418,425 | B2* | 9/2019 | Park ................. H01L 51/0097 |
| 10,572,086 | B2 | 2/2020 | Na et al. |
| 10,707,288 | B2* | 7/2020 | Li ............................ G09G 3/006 |
| 11,243,647 | B2* | 2/2022 | Seo ...................... H01L 27/323 |
| 2013/0229589 | A1* | 9/2013 | Won ........................ H01L 22/00 |
| | | | 257/48 |
| 2018/0006265 | A1* | 1/2018 | Oh ...................... H01L 51/5237 |
| 2018/0164933 | A1* | 6/2018 | Jun ..................... H01L 51/5237 |
| 2019/0004654 | A1 | 1/2019 | Gwon et al. |
| 2019/0131379 | A1* | 5/2019 | Won ..................... H01L 27/3276 |
| 2021/0191553 | A1* | 6/2021 | Jang ....................... G06F 3/0443 |

* cited by examiner

DISPLAY DEVICE AND FABRICATING METHOD THEREOF

CROSS REFERENCE TO RELATED APPLICATION

This application claims priority from and the benefit of Korean Patent Application No. 10-2020-0013360, filed on Feb. 4, 2020, which is hereby incorporated by reference for all purposes as if fully set forth herein.

BACKGROUND

Field

Exemplary embodiments of the invention relate generally to a display device including a touch sensor and a fabricating method thereof.

Discussion of the Background

Related Art

A touch sensor is a kind of information input device, and may be provided and used in a display device. In an example, the touch sensor may be attached to one surface of a display panel or be integrally formed with the display panel. A user may input information by pressing or touching the touch sensor while viewing an image displayed on a screen.

The above information disclosed in this Background section is only for understanding of the background of the inventive concepts, and, therefore, it may contain information that does not constitute prior art.

SUMMARY

Embodiments provide a display device including a touch sensor having improved reliability by minimizing a defect occurring in a fabricating process.

Embodiments also provide a fabricating method of the display device.

Additional features of the inventive concepts will be set forth in the description which follows, and in part will be apparent from the description, or may be learned by practice of the inventive concepts.

Exemplary embodiments provide a display device including a substrate including a display region in which a plurality of pixels are provided and a non-display region surrounding at least one side of the display region; a display element layer including a light emitting element provided in each of the pixels; and a touch sensor disposed on the display element layer, wherein the touch sensor includes a base layer disposed on the display element layer; a first conductive pattern disposed on the base layer; a first insulating layer provided over the first conductive pattern; a second conductive pattern disposed on the first insulating layer; a second insulating layer provided over the second conductive pattern; an intermediate layer disposed on the base layer to correspond to at least a portion of the non-display region; and a cover layer provided over the intermediate layer.

The intermediate layer and the cover layer may include different materials. The intermediate layer may include an organic insulating material, and the cover layer may include a conductive material.

The display device may further include a pad provided in at least a portion of the non-display region of the substrate, the pad having a test signal supplied thereto.

The intermediate layer may be disposed on the display element layer to correspond to the pad.

The cover layer may completely cover the intermediate layer.

Each of both end portions of the intermediate layer may be spaced apart from each of both end portions of the cover layer at a certain distance. Each of both the end portions of the intermediate layer may be located inward of each of both the end portions of the cover layer.

The second conductive pattern may include a plurality of first sensor patterns disposed on the first insulating layer, the plurality of first sensor patterns extending in a first direction; a plurality of second sensor patterns disposed on the first insulating layer, the plurality of second sensor patterns extending in a second direction different from the first direction, the plurality of second sensor patterns being spaced apart from the first sensor patterns; and a plurality of second bridge patterns connecting the second sensor patterns. The first conductive pattern may include a plurality of first bridge patterns disposed on the base layer, the plurality of first bridge patterns connecting the first sensor patterns.

The cover layer may be provided on the same layer as the first bridge patterns and include the same material as the first bridge patterns.

The cover layer may include a first cover layer provided in the same layer as the first bridge patterns, the first cover layer including the same material as the first bridge patterns; and a second cover layer provided in the same layer as the first and second sensor patterns and the second bridge patterns, the second cover layer including the same material as the first and second sensor patterns and the second bridge patterns.

The display device may further include a pixel circuit layer disposed between the substrate and the display element layer.

The pixel circuit layer may include at least one transistor provided on the substrate and a passivation layer covering the transistor. The display element layer may further include a pixel defining layer disposed on the passivation layer, the pixel defining layer defining an emission region of each of the pixels.

The passivation layer may include a first opening exposing at least a portion of the pad in the non-display region, and the pixel defining layer may include a second opening exposing at least a portion of the pad in the non-display region. A width of the first opening and a width of the second opening may be different from each other.

When viewed on a section, both side surfaces of the first opening may be located inward of both side surfaces of the second opening.

The intermediate layer may be provided in a shape filling the first and second openings.

Exemplary embodiments also provide a method of fabricating a display device, the method including providing a substrate including a display region and a non-display region; forming a plurality of transistors in the display region, and forming a pad having a test signal supplied thereto in at least a portion of the non-display region; forming a passivation layer over the transistors and the pad; forming a display element layer including light emitting elements on the passivation layer; and forming a touch sensor on the display element layer.

The forming of the touch sensor may include forming a base layer on the display element layer; forming an intermediate layer on the base layer to correspond to the pad; forming first bridge patterns on the base layer corresponding to the display region, and forming a cover layer over the intermediate layer; forming a first insulating layer over the first bridge patterns and the cover layer; forming a plurality of first sensor patterns, a plurality of second sensor patterns, and a plurality of second bridge patterns on the first insulating layer corresponding to the display region; and forming a second insulating layer over the first sensor patterns, the second sensor patterns, and the second bridge patterns. The cover layer may be provided in a shape completely covering the intermediate layer.

The intermediate layer may include an organic insulating material, and the cover layer may include a conductive material.

The forming of the cover layer may include forming a conductive layer on the intermediate layer; forming, on the conductive layer, a photosensitive pattern including an opening exposing one region of the conductive layer; removing the exposed region of the conductive layer by performing an etching process, using the photosensitive pattern as a mask; and removing the photosensitive pattern.

Each of both end portions of the intermediate layer may be spaced apart from each of both end portions of the cover layer at a certain distance. Each of both the end portions of the intermediate layer may be located inward of the each of both the end portions of the cover layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

Figure 1A:
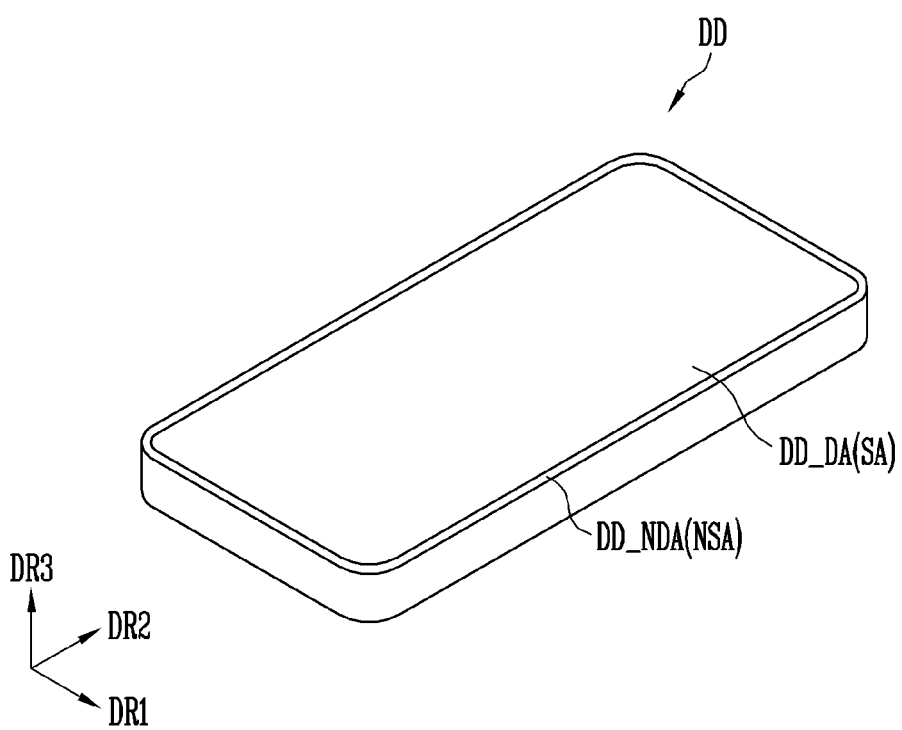

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1A is a perspective view illustrating a display device in accordance with an embodiment of the inventive concepts.

Figure 1B:
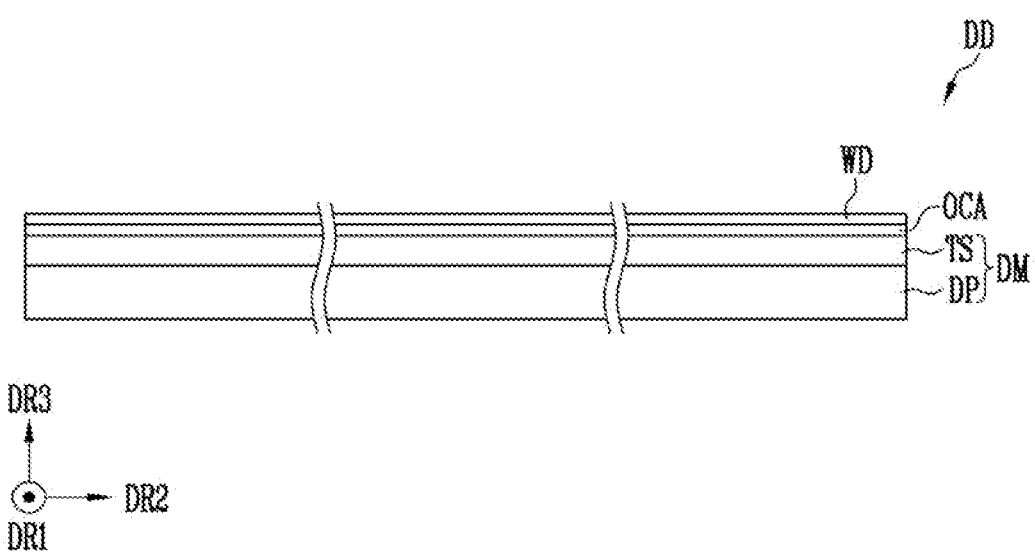

FIG. 1B is a schematic sectional view illustrating the display device shown in FIG. 1A.

Figure 2:
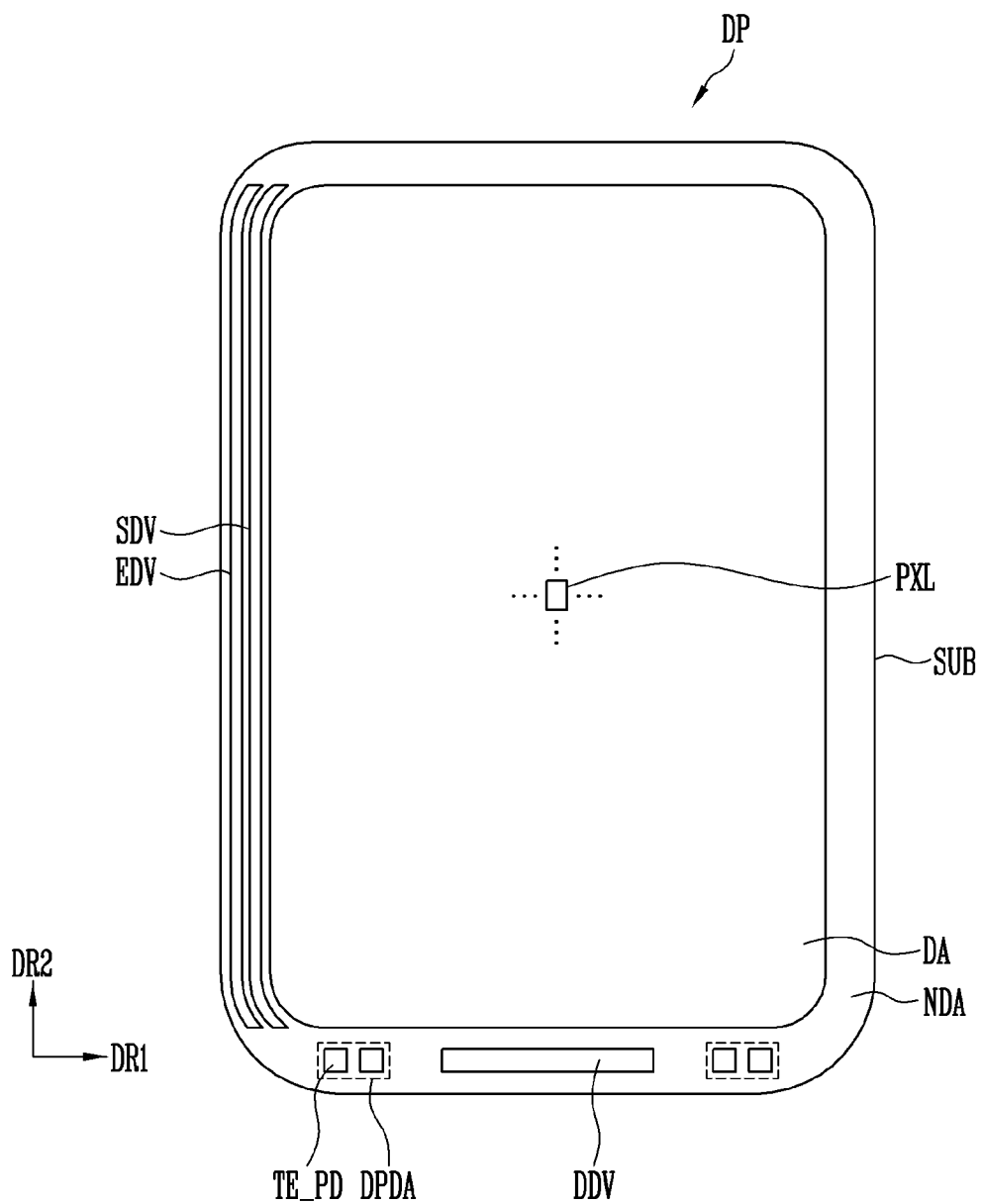

FIG. 2 is a plan view schematically illustrating a display panel shown in FIG. 1B.

Figure 3A:
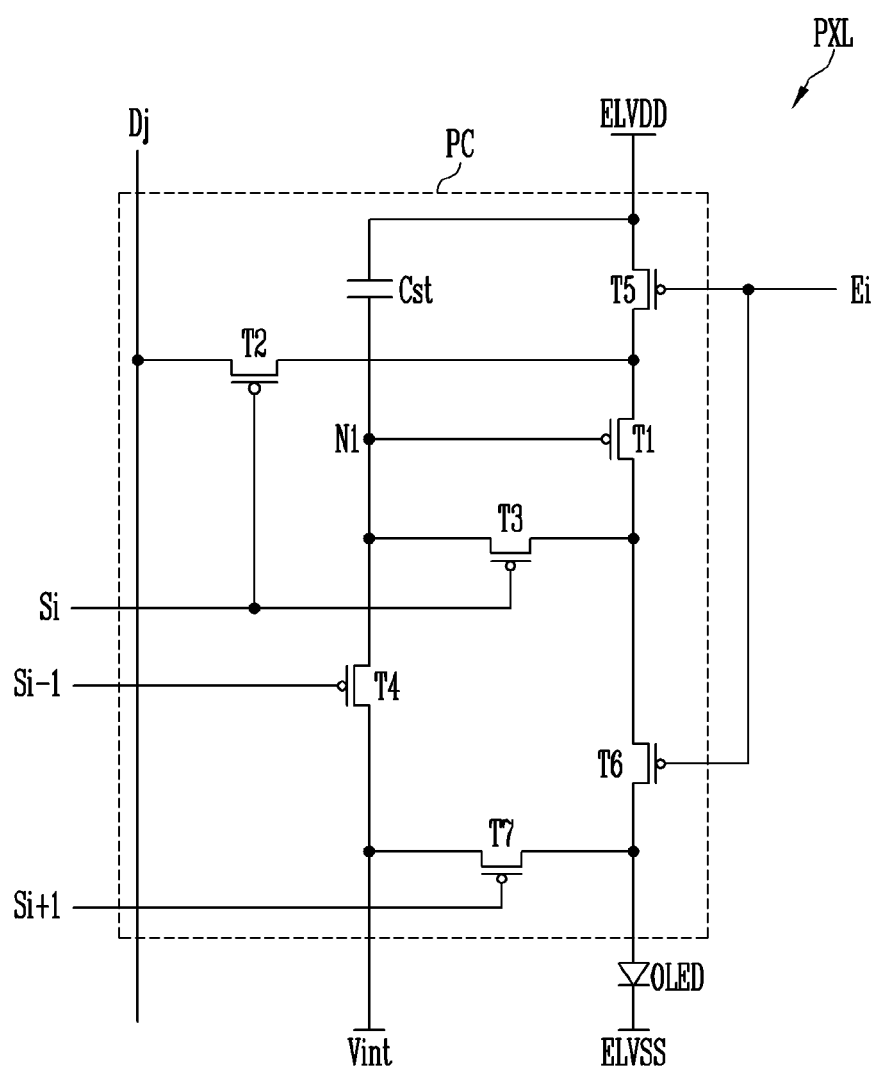

FIG. 3A is an equivalent circuit diagram illustrating an electrical connection relationship of components included in one pixel among pixels shown in FIG. 2.

Figure 3B:
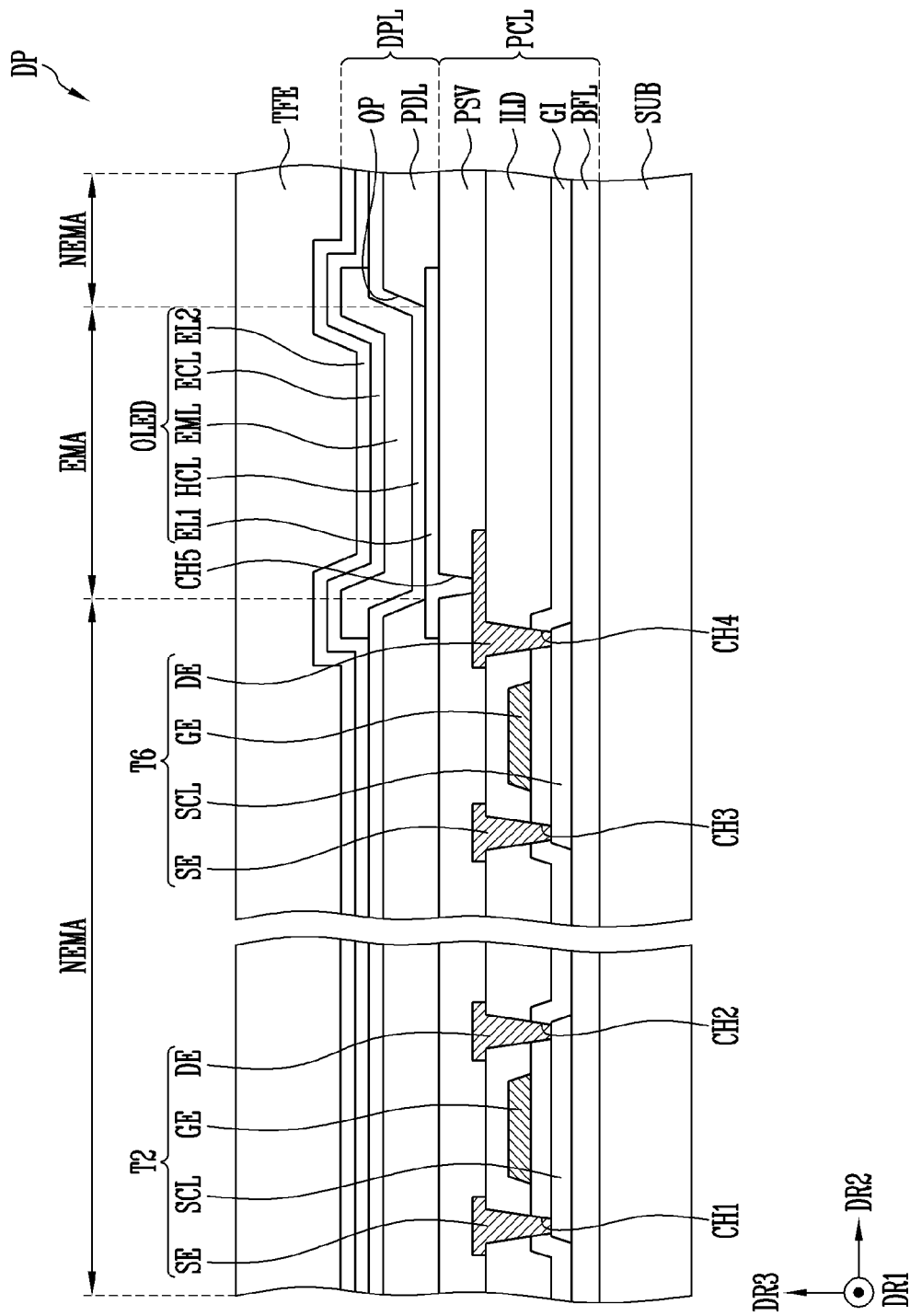

FIG. 3B is an enlarged sectional view illustrating a portion of the display panel shown in FIG. 2.

Figure 4:
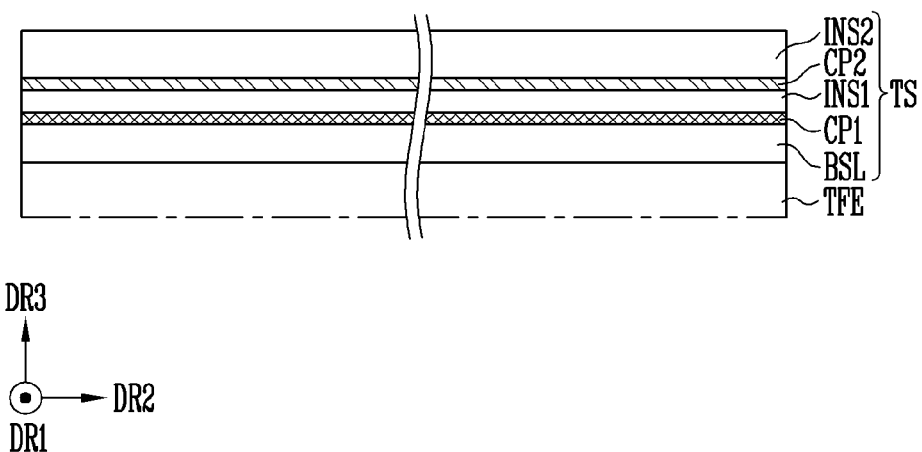

FIG. 4 is a schematic sectional view illustrating a touch sensor shown in FIG. 1B.

Figure 5:
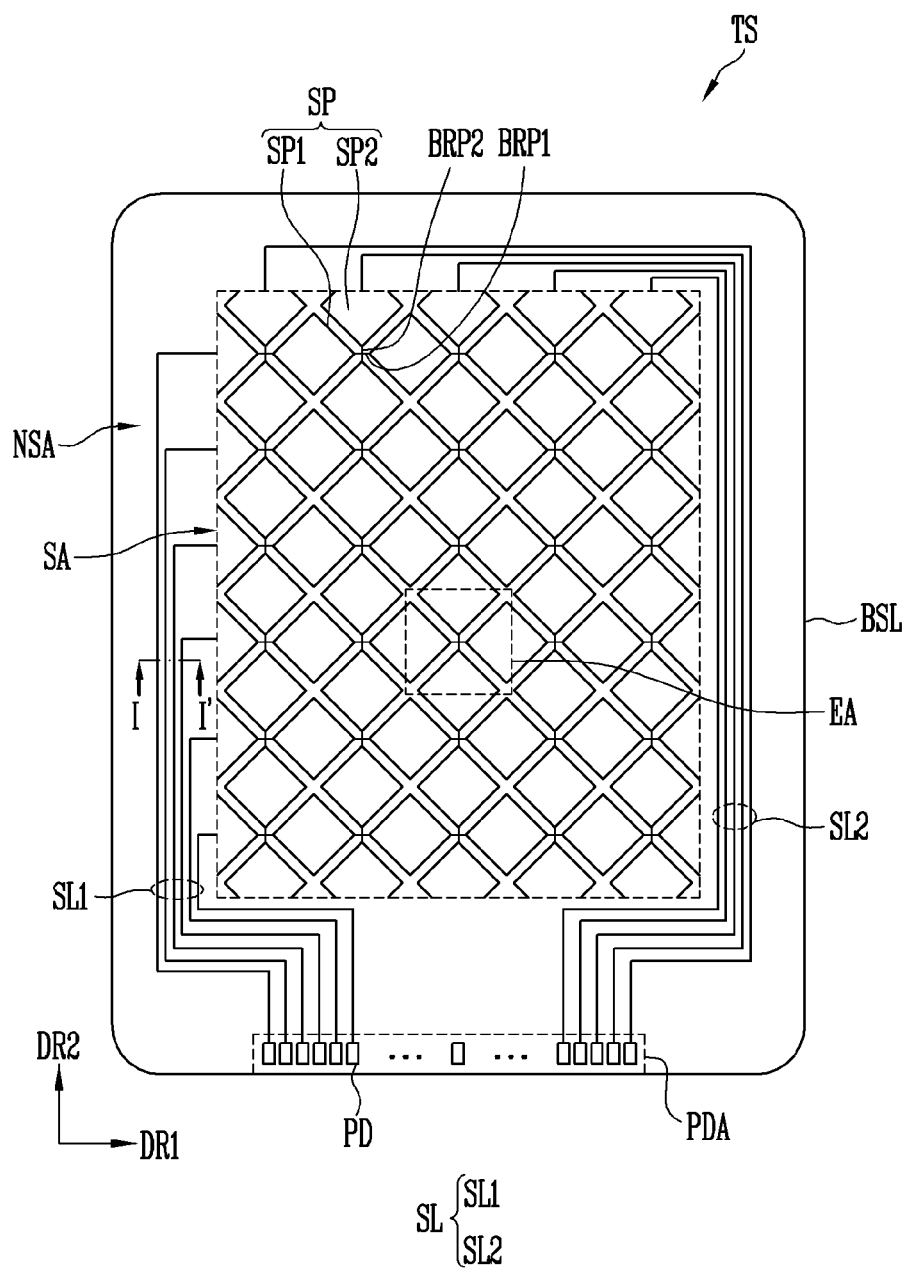

FIG. 5 is a schematic plan view illustrating the touch sensor shown in FIG. 1B.

Figure 6A:
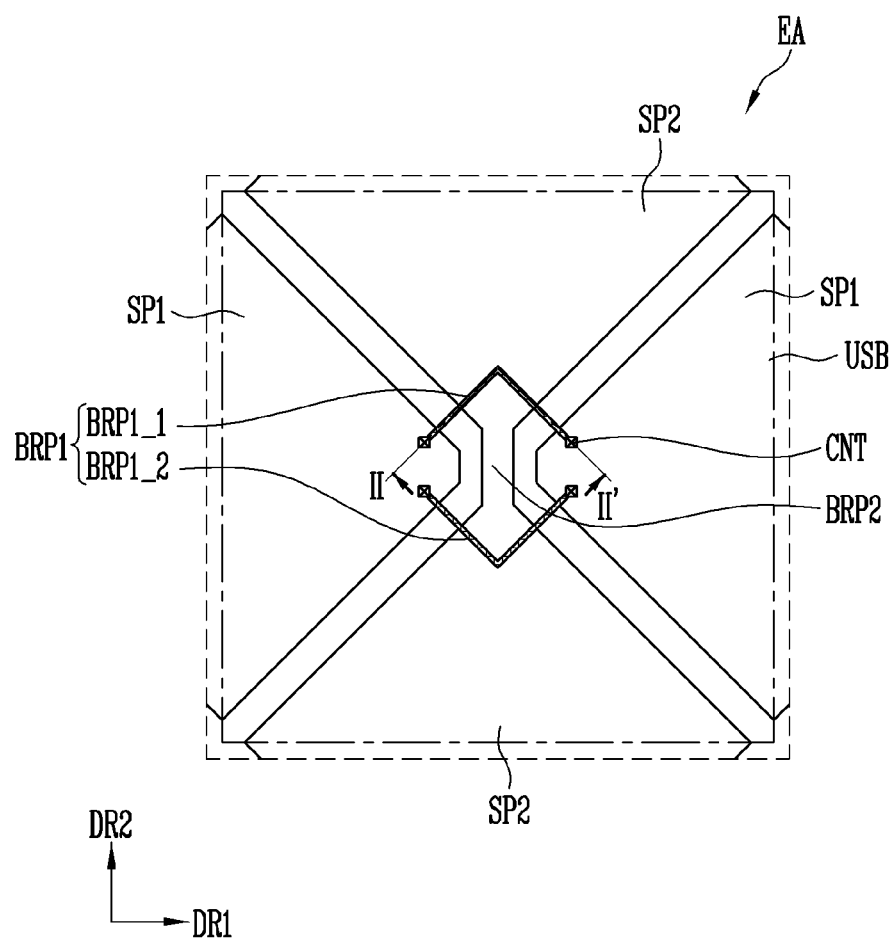

FIG. 6A is an enlarged plan view schematically illustrating an example of portion EA1 shown in FIG. 5.

Figure 6B:
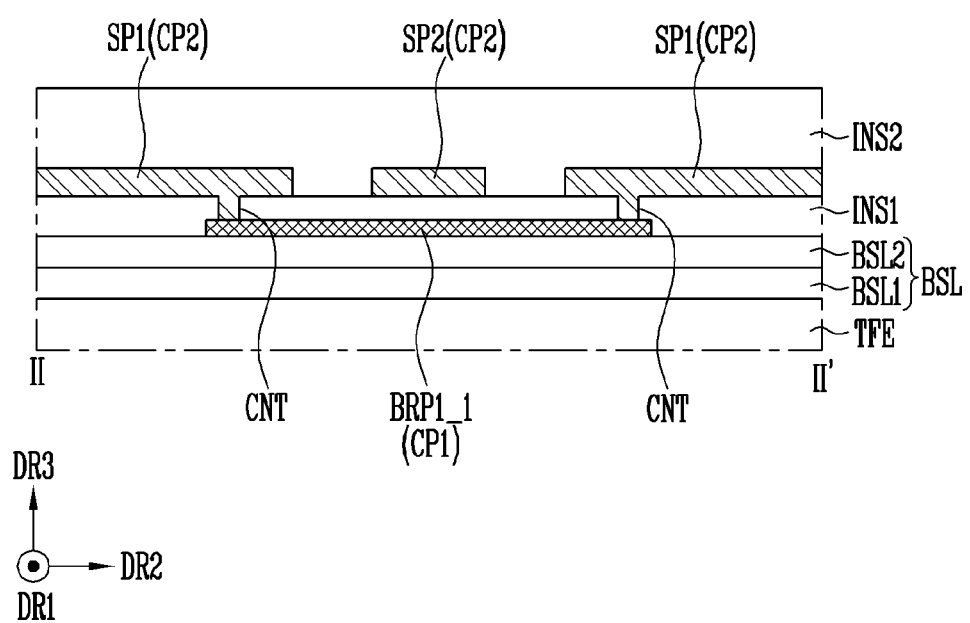

FIG. 6B is a sectional view taken along line II-II' shown in FIG. 6A.

Figure 6C:
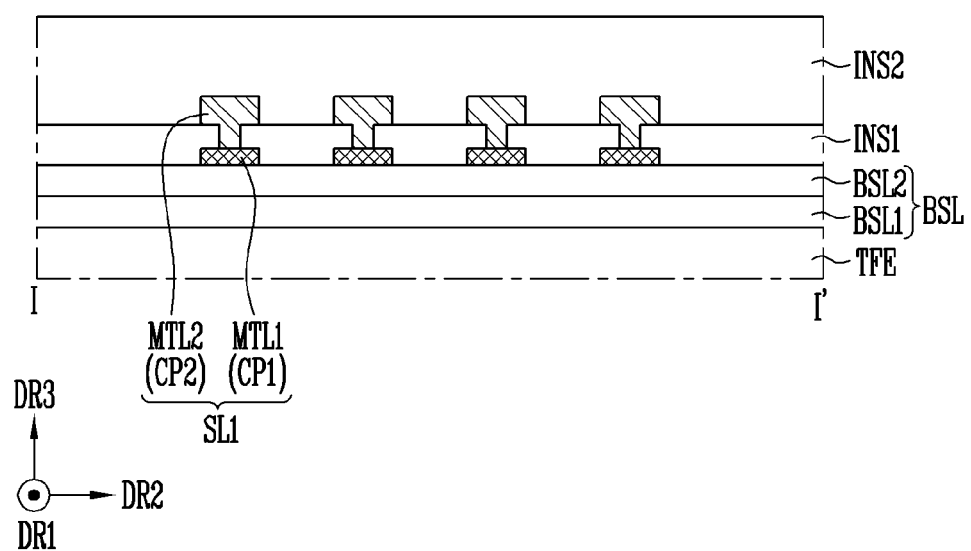

FIG. 6C is a sectional view taken along line I-I' shown in FIG. 5.

Figure 7:
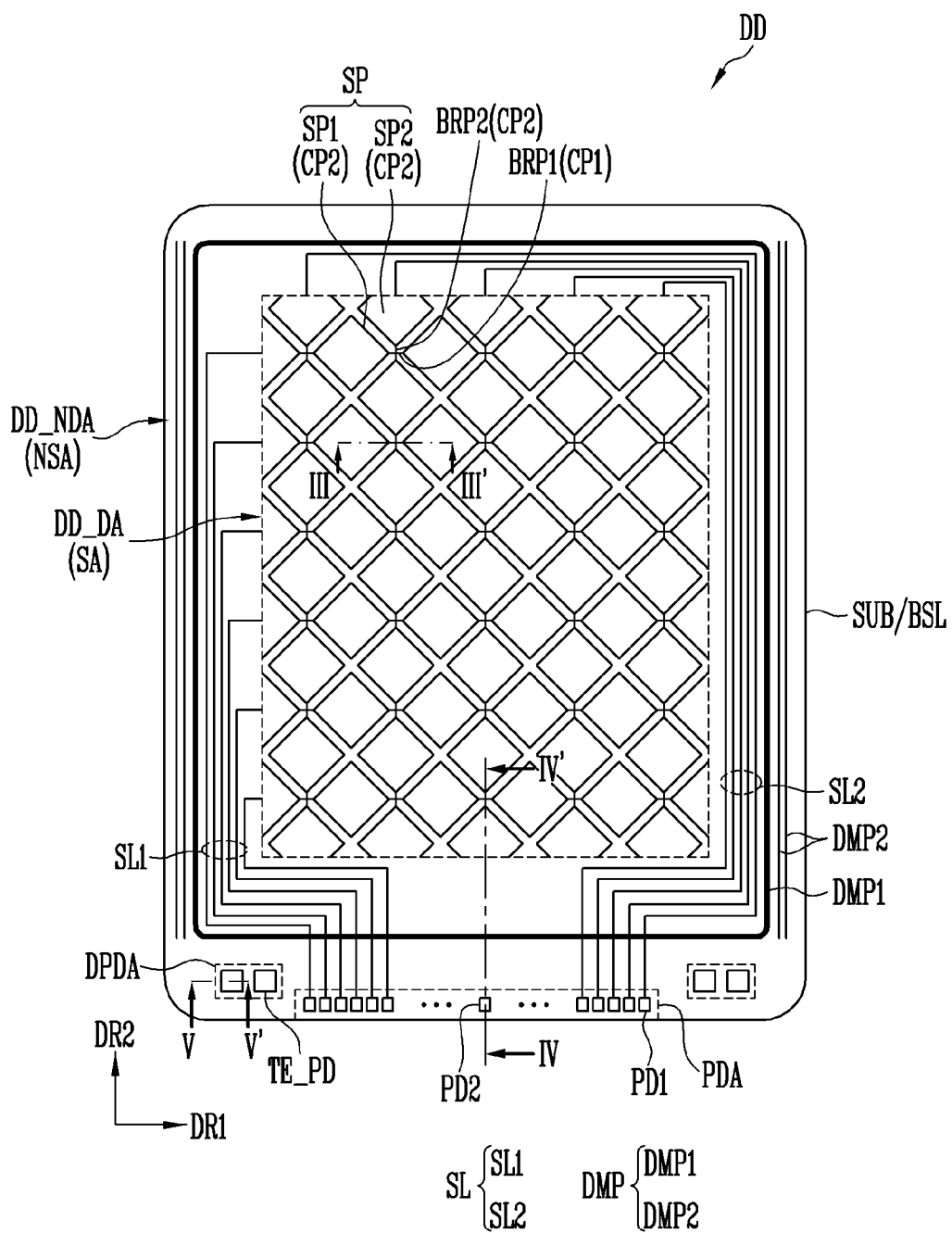

FIG. 7 is a plan view illustrating a display device in accordance with an embodiment of the inventive concepts.

Figure 8:
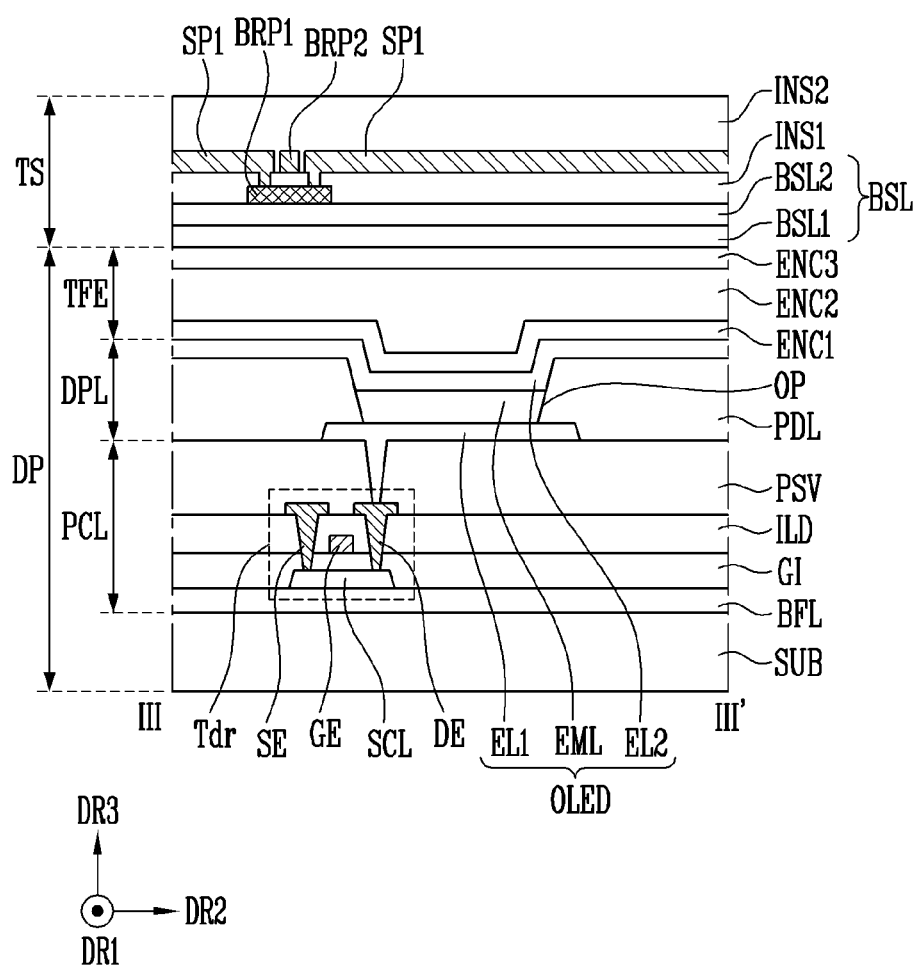

FIG. 8 is a sectional view taken along line III-III' shown in FIG. 7.

Figure 9:
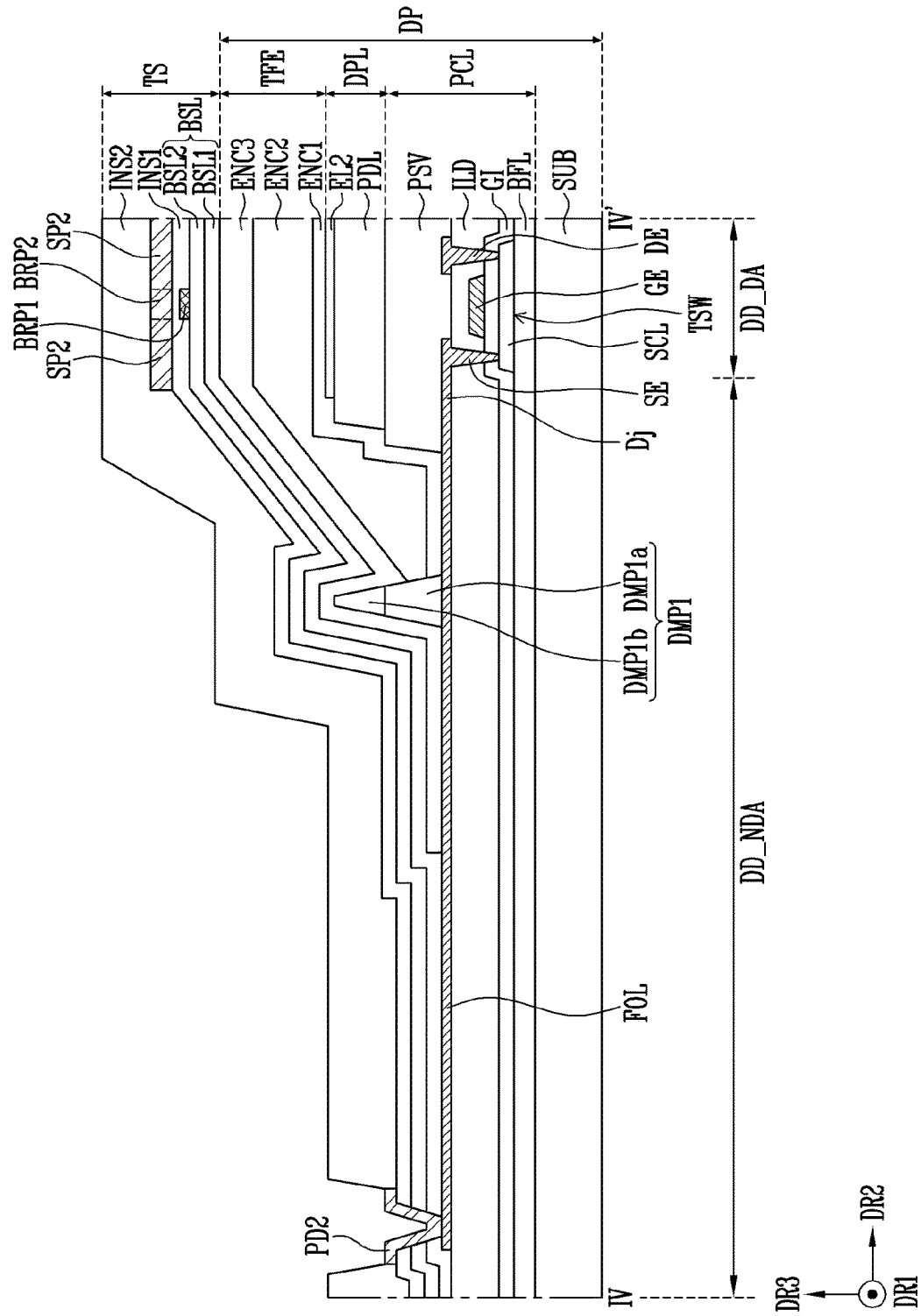

FIG. 9 is a sectional view taken along line IV-IV' shown in FIG. 7.

Figure 10:
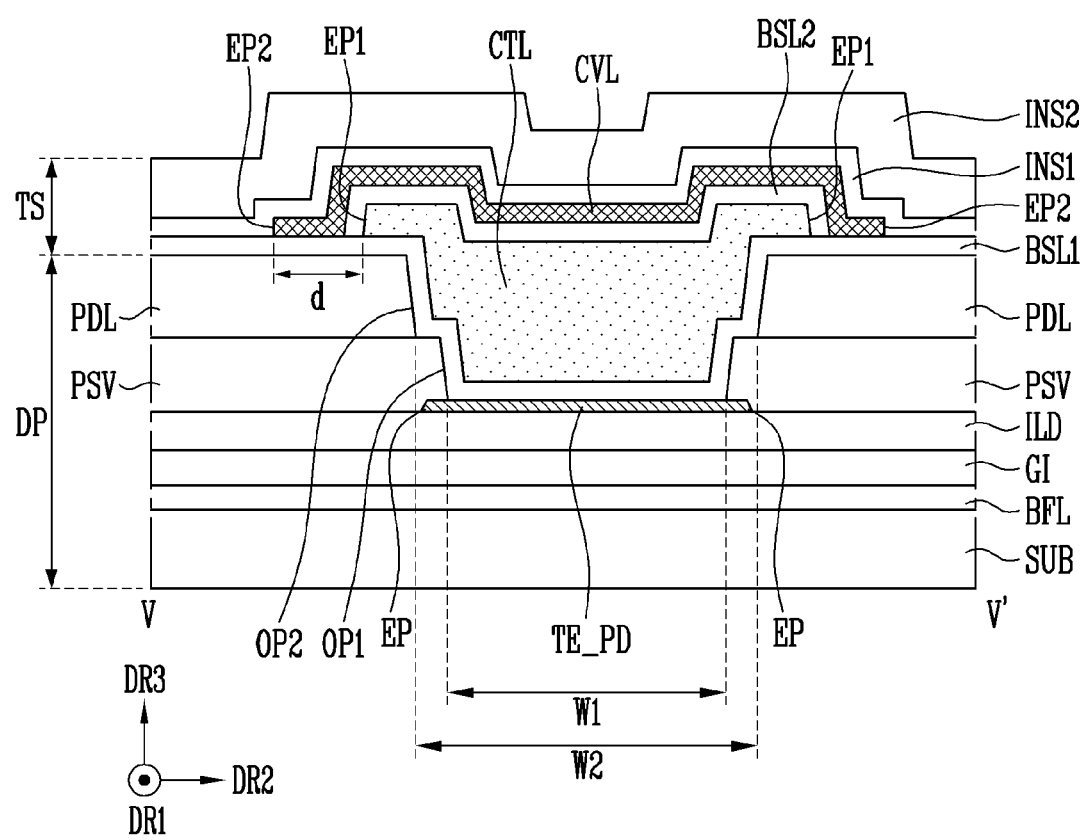

FIG. 10 is a sectional view taken along line V-V' shown in FIG. 7.

Figure 11:
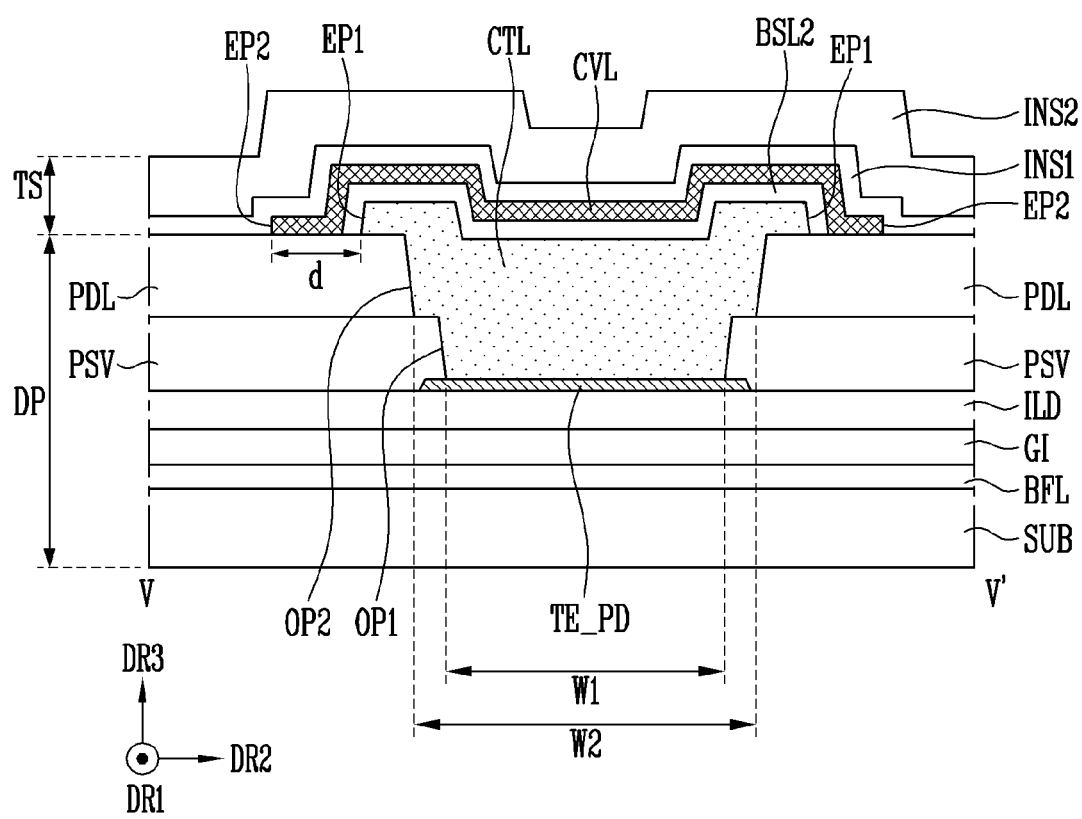

FIG. 11 illustrates an intermediate layer shown in FIG. 10 in another form, which is a sectional view corresponding to the line V-V' shown in FIG. 7.

Figure 12A:
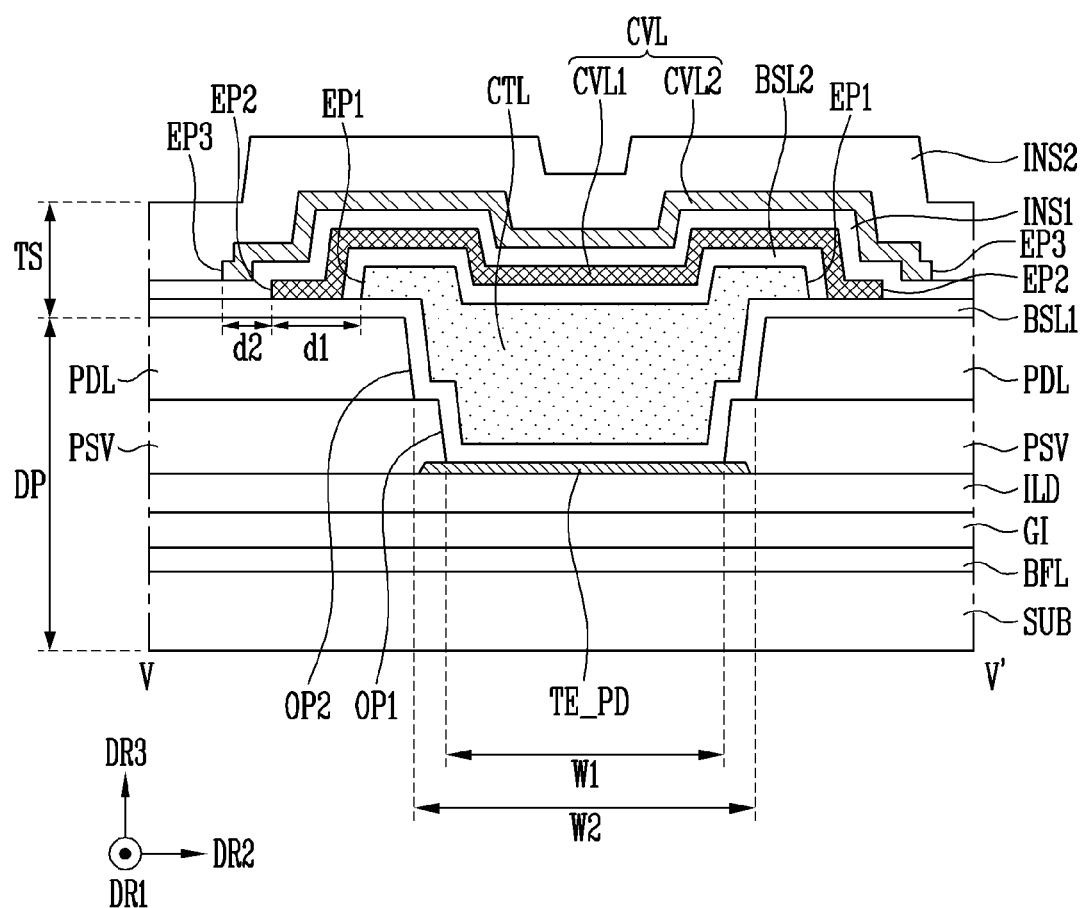
Figure 12B:
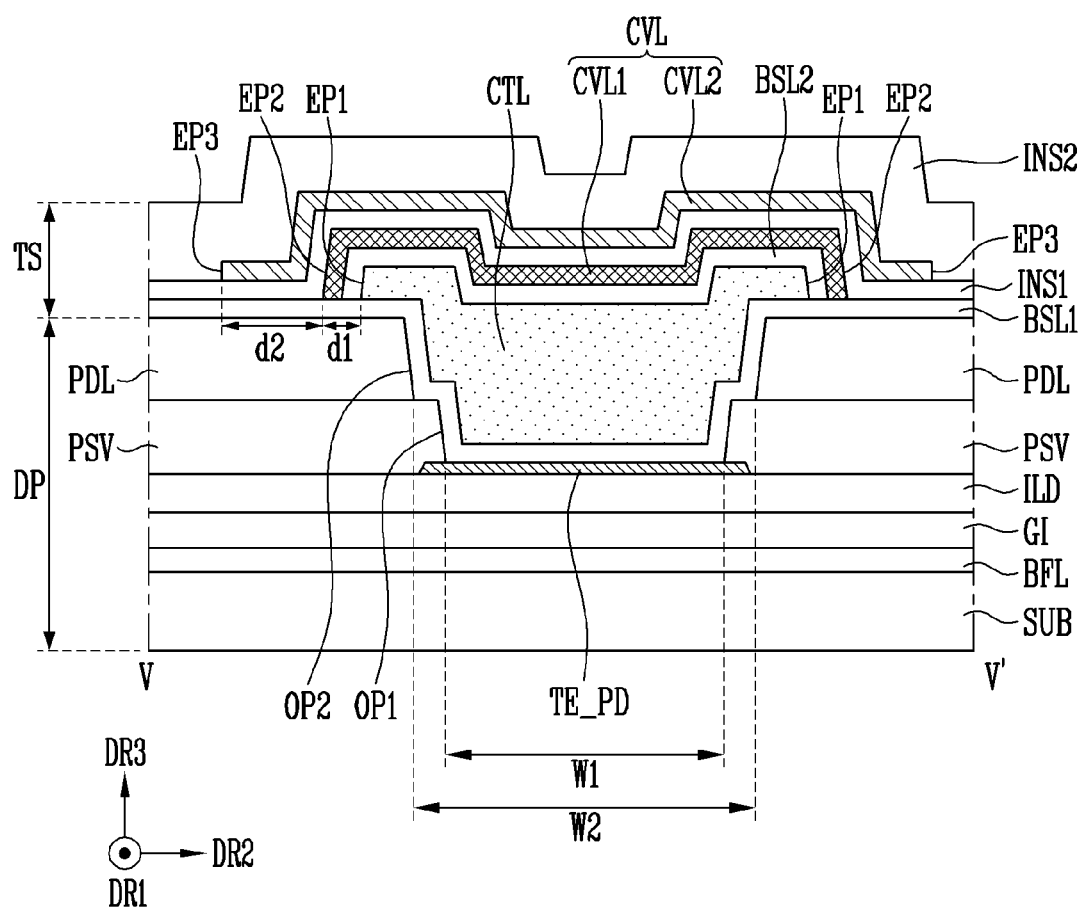
Figure 13A:
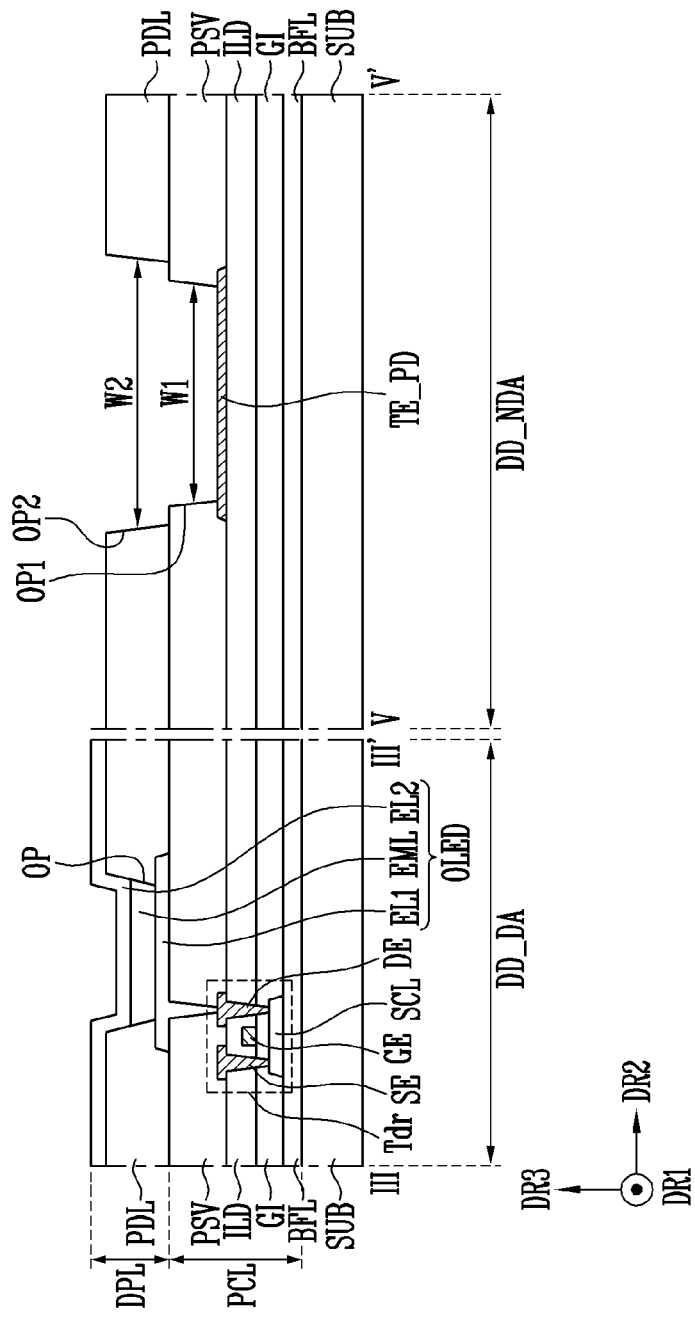
Figure 13B:
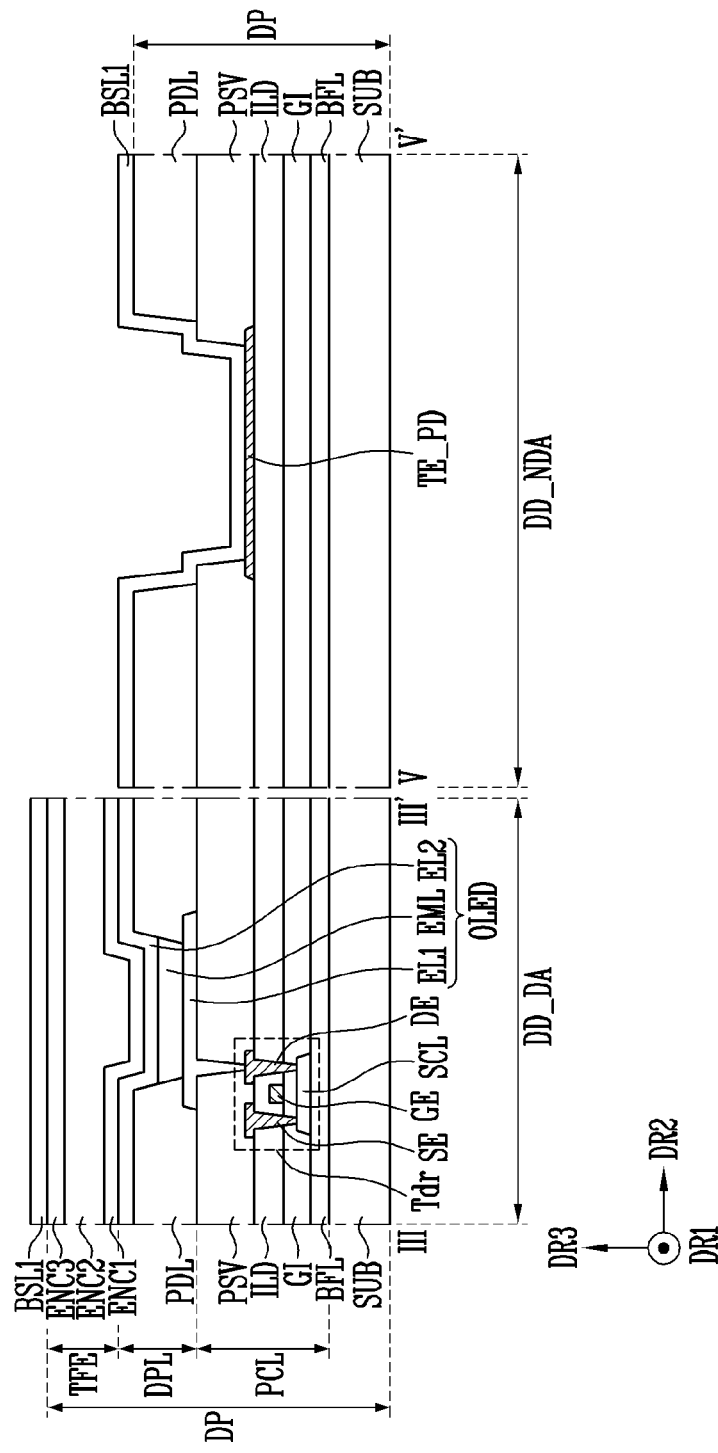
Figure 13C:
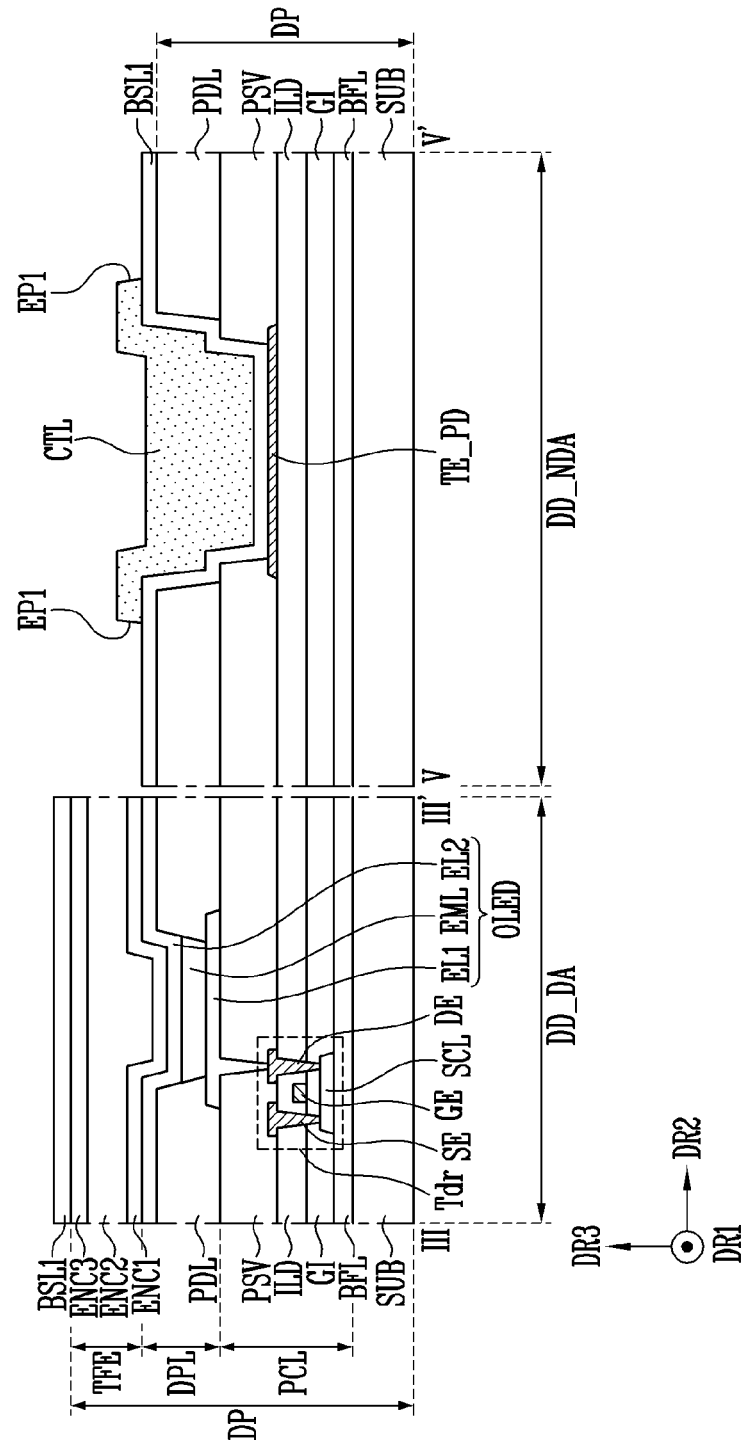
Figure 13D:
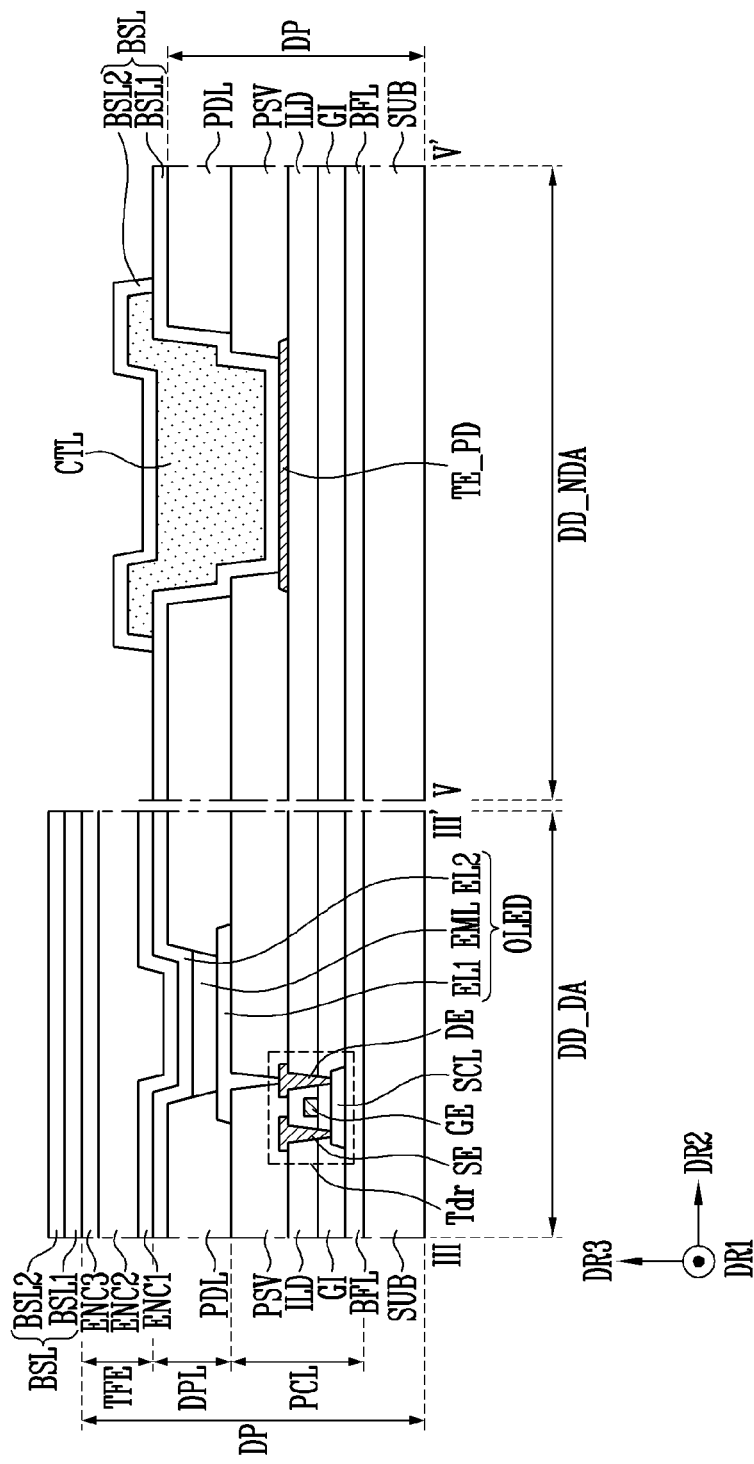
Figure 13E:
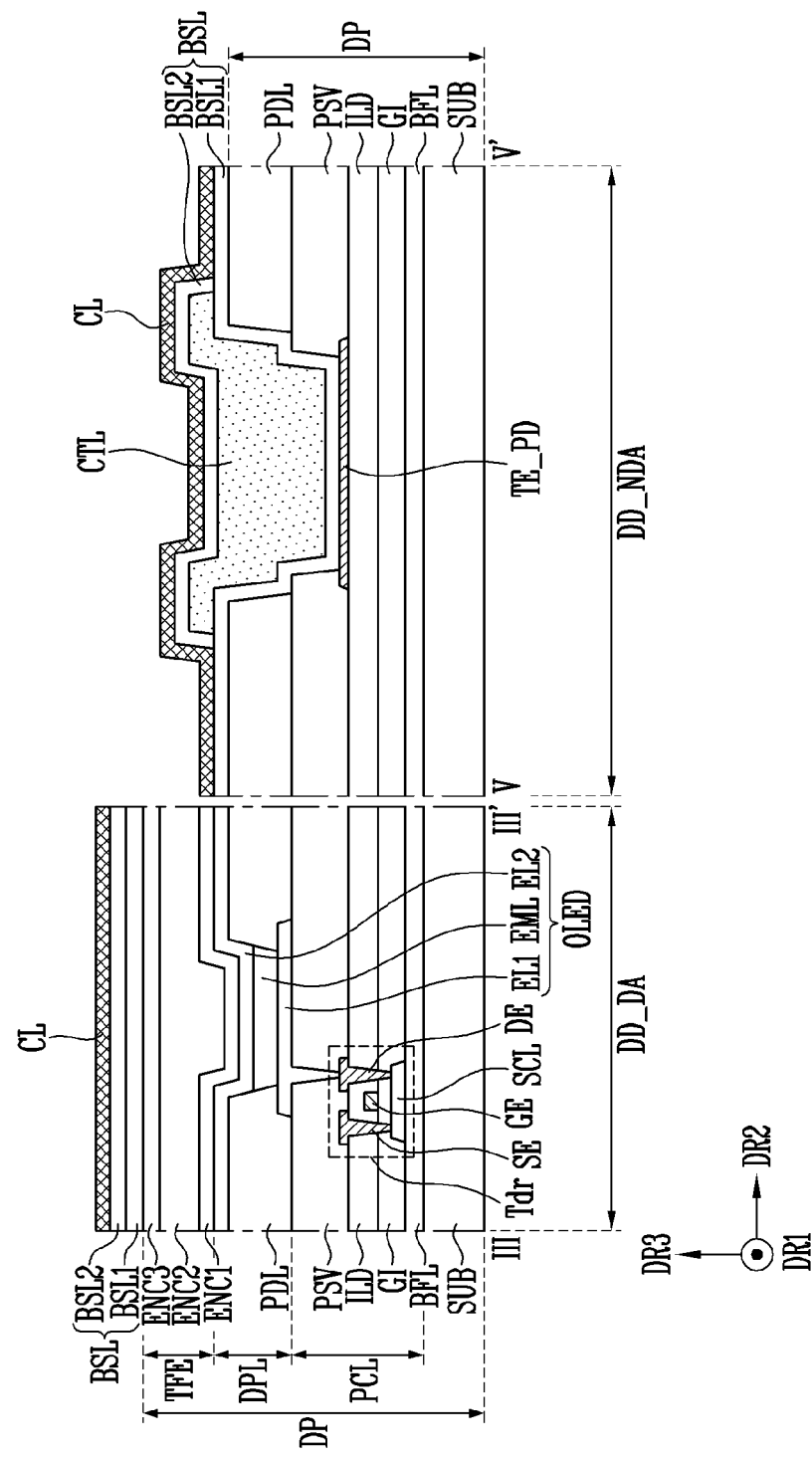
Figure 13F:
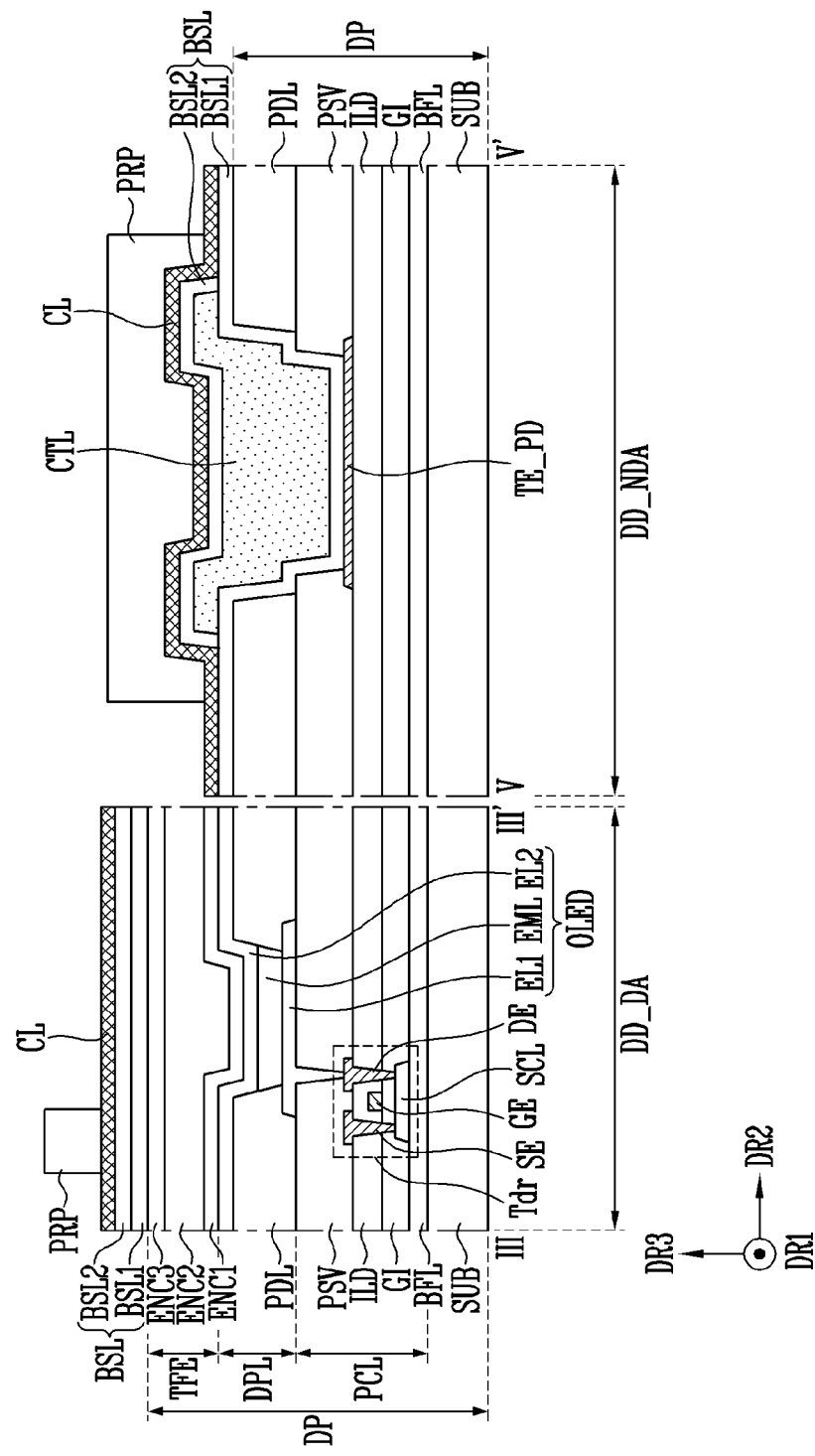
Figure 13G:
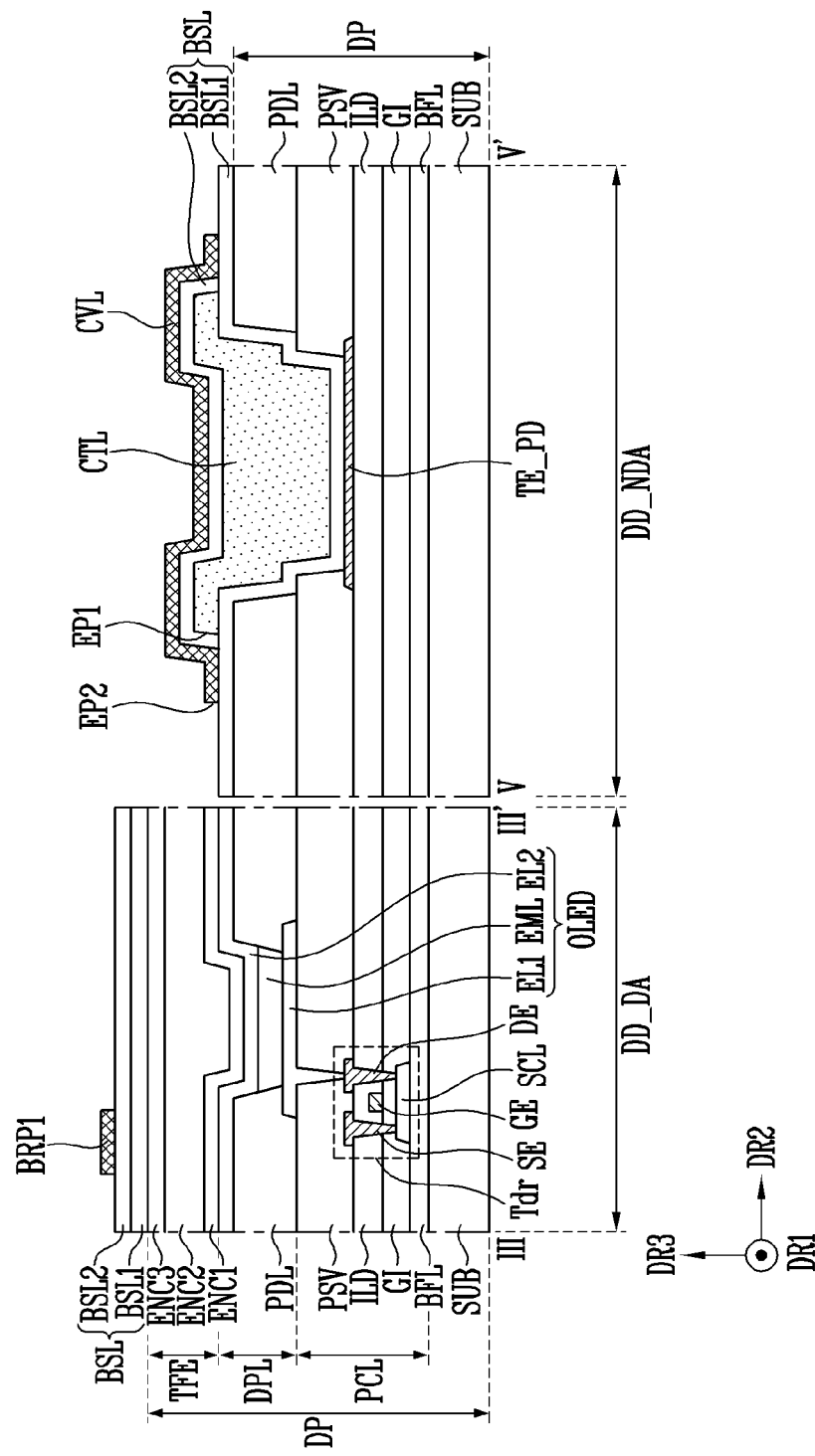
Figure 13H:
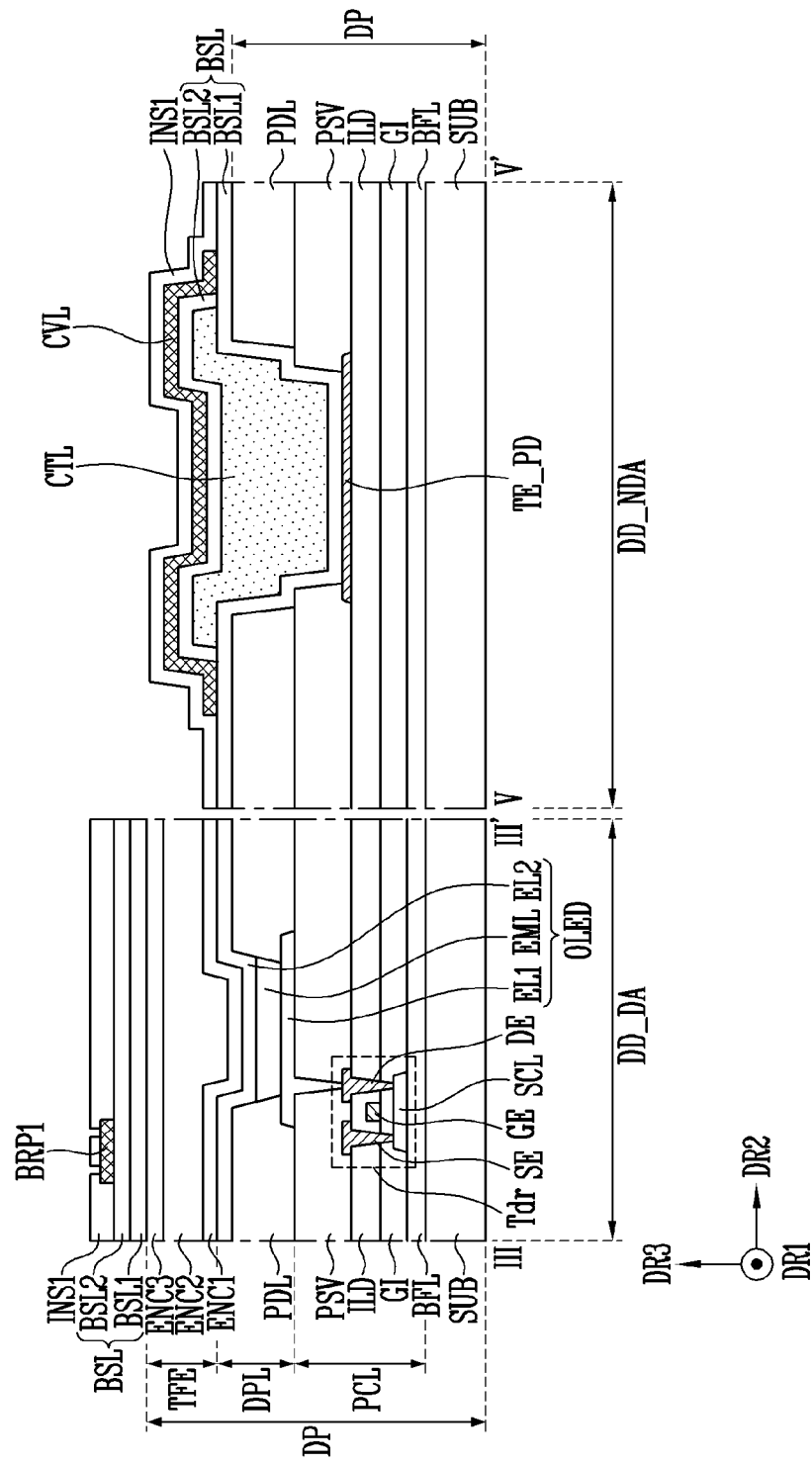
Figure 13I:
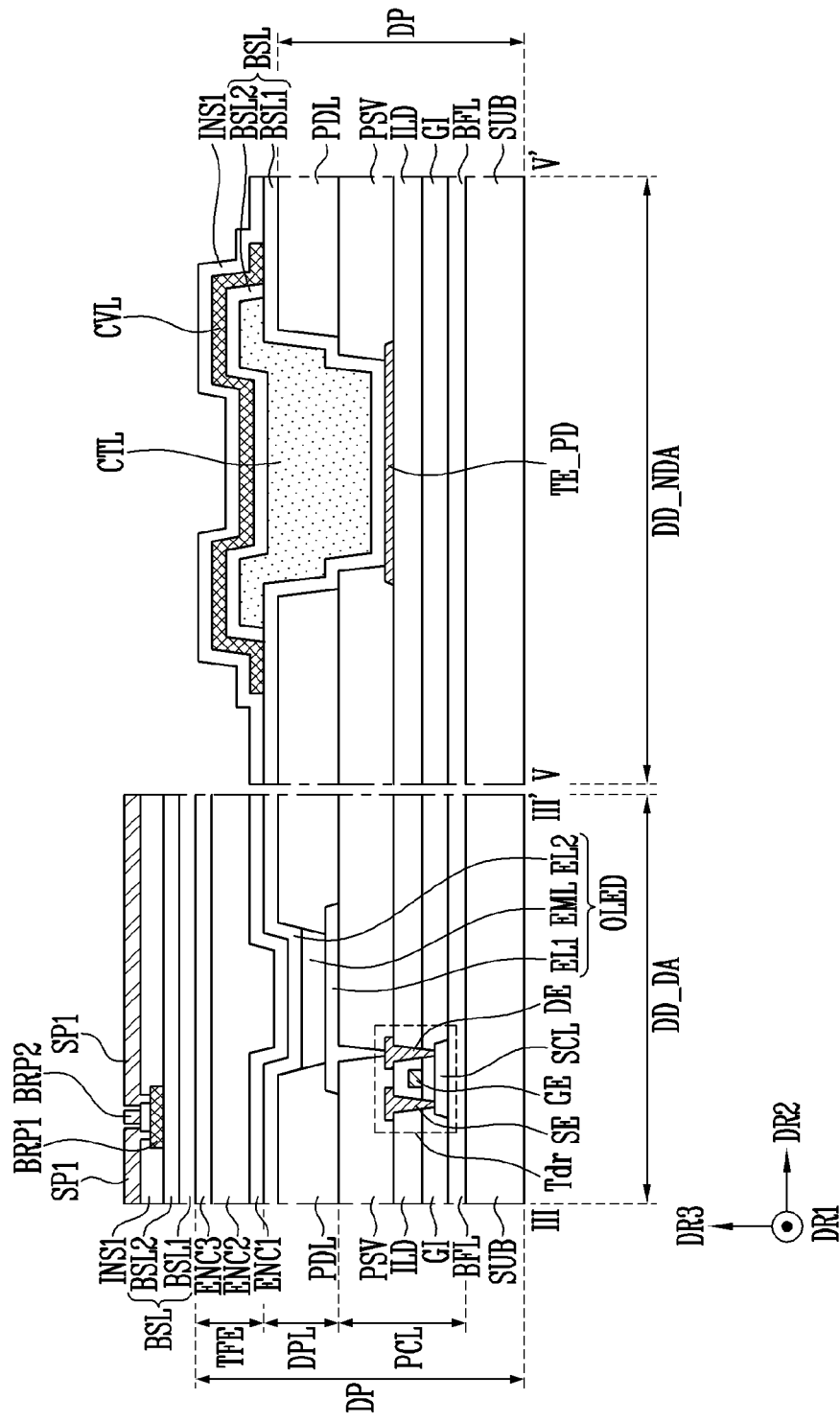
Figure 13J:
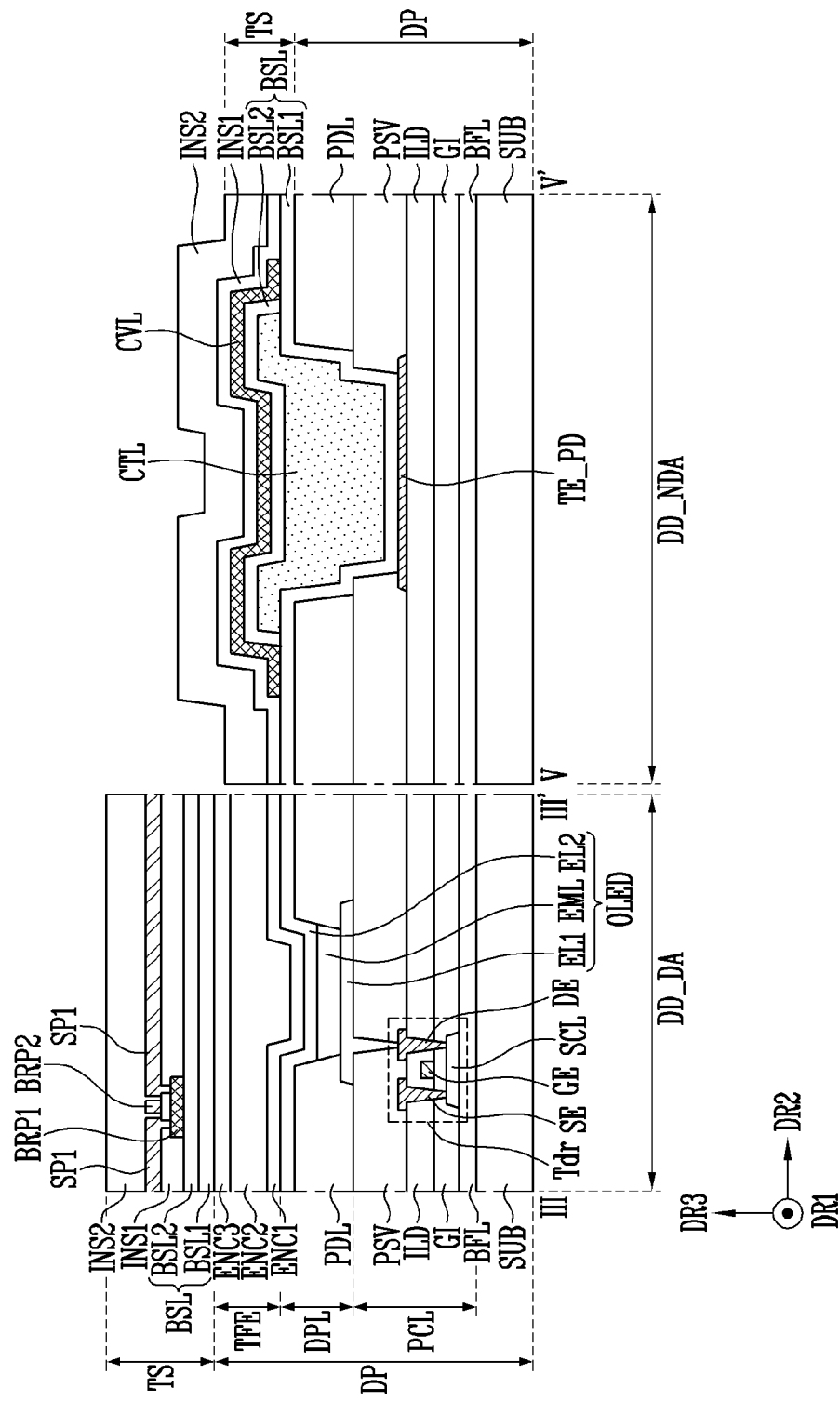

FIGS. 12A and 12B illustrate a cover layer shown in FIG. 10 in another form, which are sectional views corresponding to the line V-V' shown in FIG. 7.

FIGS. 13A, 13B, 13C, 13D, 13E, 13F, 13G, 13I, and 13J are schematic sectional views sequentially illustrating a fabricating method of one region of a display region of the display device shown in FIG. 8 and one region of a non-display region of the display device shown in FIG. 10.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts and items required for those skilled in the art to easily understand the content of the present disclosure will be described in detail with reference to the accompanying drawings. In the following description, singular forms in the inventive concepts are intended to include the plural forms as well, unless the context clearly indicates otherwise.

FIG. 1A is a perspective view illustrating a display device in accordance with an embodiment of the inventive concepts. FIG. 1B is a schematic sectional view illustrating the display device shown in FIG. 1A.

Referring to FIGS. 1A and 1B, the display device DD may include a display module DM and a window WD.

The display device DD may be provided in various shapes. In an example, the display device DD may be provided in a rectangular plate shape having two pairs of sides parallel to each other, but the inventive concepts are not limited thereto. When the display device DD is provided in the rectangular plate shape, any one pair of sides among the two pairs of sides may be provided longer than the other pair of sides. In an embodiment of the inventive concepts, a case where the display device DD is provided in a rectangular shape having a pair of long sides and a pair of short sides is illustrated for convenience of description. An extending direction of the long sides is represented as a second direction DR2, an extending direction of the short sides is represented as a first direction DR1, and a direction perpendicular to the extending directions of the long sides and the short sides is represented as a third direction DR3. The direction DR3 may be referred to as a thickness direction. As described above, in the display device DD provided in the rectangular plate shape, a corner portion at which one long side and one short side are in contact with each other may have a round shape.

In an embodiment of the inventive concepts, at least a portion of the display device DD may have flexibility, and the display device DD may be folded at a portion having flexibility.

The display device DD may include a display region DD_DA configured to display an image and a non-display region DD_NDA provided adjacent at least one side of the display region DD_DA. The non-display region DD_NAD is a region in which the image is not displayed.

In some embodiments, the display device DD may include a sensing region SA and a non-sensing region NSA when user touch is configured to be received and detected. The display device DD may not only display an image through the sensing region SA but also sense a touch input made on a display surface thereof. The sensing region SA may also sense light incident from the front thereof. The non-sensing region NSA may surround the sensing region SA. However, this is merely illustrative, and the inventive concepts are not limited thereto. Although a case where the sensing region SA has a shape including a round-shaped corner and corresponds to the display region DD_DA as illustrated in FIG. 1A, the inventive concepts are not limited thereto. In some embodiments, a partial region of the display region DD_DA may correspond to the sensing region SA.

The shape, size, and arrangement position of the sensing region SA of the display device DD may be variously modified according to sensor patterns which will be described later.

The display module DM may include a display panel DP and a touch sensor TS.

The display panel DP may display an image. Self-luminescent display panels such as an organic light emitting display panel (OLED panel) may be used as the display panel DP. Also, non-luminescent display panels such as a liquid crystal display panel (LCD panel), an electrophoretic display panel (EPD panel), and an electro-wetting display panel (EWD panel) may be used as the display panel DP. When a non-luminescent display panel is used as the display panel DP, the display device DD may have a backlight unit configured to supply light to the display panel DP.

The touch sensor TS may be directly disposed on a surface from which an image of the display panel DP is emitted, to receive a touch input of a user. In an embodiment of the inventive concepts, the term "directly disposed" excludes attachment using a separate adhesive layer (or gluing layer), and refers to formation through a continuous process. The touch sensor TS may recognize a touch event of the display device DD through a hand of a user or a separate input means. The touch sensor TS may recognize a touch event by using a capacitive method.

The touch sensor TS may have a multi-layered structure. The touch sensor TS may include a single- or multi-layered conductive layer, and include a single- or multi-layered insulating layer.

The window WD is configured to protect an exposed surface of the display module DM and may be provided on the display module DM. The window WD may protect the display module DM from external impact, and provide an input surface and/or a display surface to a user. The window WD may be coupled to the display module DM by using an Optically Clear Adhesive (or gluing) (OCA) member.

The window WD may have a multi-layered structure selected from a glass substrate, a plastic film, and a plastic substrate. The multi-layered structure may be formed through a continuous process or an attachment process using an adhesive layer. The whole or a portion of the window WD may have flexibility.

FIG. 2 is a plan view schematically illustrating a display panel shown in FIG. 1B.

Referring to FIGS. 1A, 1B, and 2, the display panel DP may include a substrate SUB, pixels PXL provided on the substrate SUB, a driver provided on the substrate SUB, the driver driving the pixels PXL, and a line unit connecting the pixels PXL and the driver.

The substrate SUB may be provided as one region having an approximately rectangular shape. However, a number of regions provided in the substrate SUB may be different therefrom, and the shape of the substrate SUB may be changed depending on a region provided in the substrate SUB.

The substrate SUB may be made of an insulative material such as glass or resin. Also, the substrate SUB may be made of a material having flexibility to be bendable or foldable, and have a single- or multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like.

The material(s) that make up the substrate SUB may be variously changed, and the substrate SUB may be made of a fiber reinforced plastic (FRP), etc.

The substrate SUB may include a display region DA and a non-display region NDA. The display region DA may be a region provided with the pixels PXL to display an image, and the non-display region NDA is a region in which the pixels PXL are not provided. The non-display region NDA may be a region in which the image is not displayed. For convenience of description, only one pixel PXL is illustrated in FIG. 2, but a plurality of pixels PXL may be substantially arranged in the display region DA of the substrate SUB.

The display region DA of the display panel DP may correspond to the display region DD_DA of the display device DD, and the non-display region NDA of the display panel DP may correspond to the non-display region DD_NDA of the display device DD.

The non-display region NDA may be provided with the driver configured to drive the pixels PXL and some of lines (not illustrated) connecting the pixels PXL and the driver. The non-display region NDA may correspond to a bezel region of the display device DD.

The pixels PXL may be provided in the display region DA of the substrate SUB. Each of the pixels PXL may be a minimum unit configured to display an image. Each of the pixels PXL may include an organic light emitting element configured to emit white light and/or colored light. Each of the pixels PXL may emit any one color among red, green, and blue. However, the inventive concepts are not limited thereto, and the pixel PXL may emit light of a color such as cyan, magenta or yellow.

The pixels PXL may be arranged in a matrix form along rows extending in a first direction DR1 and columns extending in a second direction DR2 intersecting the first direction DR1. However, the arrangement form of the pixels PXL is not particularly limited, and the pixels PXL may be arranged in various forms.

The driver provides signals to each of the pixels PXL through the line unit, and controls driving of the pixels PXL. For convenience of description, the line unit is omitted in FIG. 2. The line unit will be described later with reference to FIG. 3A.

The driver may include a scan driver SDV configured to transfer a scan signal to each of the pixels PXL along a scan line, an emission driver EDV configured to provide an emission control signal to each of the pixels PXL along an emission control line, a data driver DDV configured to provide a data signal to each of the pixels PXL along a data line, and a timing controller (not illustrated). The timing controller controls the scan driver SDV, the emission driver EDV, and the data driver DDV.

Meanwhile, the display panel DP may further include a dummy pad unit DPDA provided in the non-display region NDA.

The dummy pad unit DPDA may be a way to evaluate an electrical characteristic of the display panel DP. Specifically, the dummy pad unit DPDA may be electrically connected to a testing apparatus (not illustrated). The dummy pad unit DPDA may be configured to receive a predetermined signal (e.g., a signal to test an operating state of the display panel DP before a final product is released) supplied from the testing apparatus and transfer the received signal to signal lines disposed in the display region DA of the display panel DP. To this end, the dummy pad unit DPDA may include at least one test pad TE_PD connecting the testing apparatus to the signal lines.

The test pad TE_PD may be formed through the same process as a process of forming an element which becomes a target to be tested. In an embodiment of the inventive concepts, whether a defect has occurred in the element which becomes the target to be tested may be determined through the dummy pad unit DPDA.

FIG. 3A is an equivalent circuit diagram illustrating an electrical connection relationship of components included in one pixel PXL among the pixels shown in FIG. 2.

Referring to FIGS. 1A to 3A, each of the pixels PXL may include a light emitting element OLED and a pixel circuit PC configured to drive the light emitting element OLED. In an embodiment of the inventive concepts, the light emitting element OLED may refer to an organic light emitting diode.

The pixel circuit PC may be connected to a scan line Si and a data line Dj of a corresponding pixel PXL. In an example, when a pixel PXL is disposed on an ith (i is a natural number) row and a jth (j is a natural number) column of the display region DA of the display panel DP, the pixel circuit PC of the pixel PXL may be connected to an ith scan line Si and a jth data line Dj of the display region DA. In some embodiments, the pixel circuit PC may be further connected to at least another scan line. For example, one pixel PXL disposed on the ith row of the display region DA may be further connected to an (i−1)th scan line Si−1 and/or an (i+1)th scan line Si+1. In some embodiments, the pixel circuit PC may be further connected to a third power source in addition to first and second pixel power sources ELVDD and ELVSS. For example, the pixel circuit PC may also be connected to an initialization power source Vint.

The pixel circuit PC may include first to seventh transistors T1 to T7 and a storage capacitor Cst.

One electrode, e.g., a source electrode of the first transistor T1 (driving transistor) may be connected to a power line to which a first pixel power source ELVDD is applied via the fifth transistor T5, and another electrode, e.g., a drain electrode of the first transistor T1 may be connected to the light emitting element OLED via the sixth transistor T6. In addition, a gate electrode of the first transistor T1 may be connected to a first node N1. The first transistor T1 controls a driving current flowing between the first pixel power source ELVDD and a second pixel power source ELVSS via the light emitting element OLED, corresponding to a voltage of the first node N1.

The second transistor T2 (switching transistor) may be connected between the jth data line Dj connected to the pixel PXL and the source electrode of the first transistor T1. In addition, a gate electrode of the second transistor T2 may be connected to the ith scan line Si connected to the pixel PXL. The second transistor T2 may be turned on when a scan signal having a gate-on voltage (e.g., a low voltage) is supplied from the ith scan line Si, to electrically connect the jth data line Dj to the source electrode of the first transistor T1. Therefore, when the second transistor T2 is turned on, a data signal supplied from the jth data line Dj is transferred to the first transistor T1.

The third transistor T3 may be connected between the drain electrode of the first transistor T1 and the first node N1. In addition, a gate electrode of the third transistor T3 may be connected to the ith scan line Si. The third transistor T3 may be turned on when a scan signal having a gate-on voltage is supplied from the ith scan line Si, to electrically connect the drain electrode of the first transistor T1 and the first node N1.

The fourth transistor T4 may be connected between the first node N1 and an initialization power line to which the initialization power source Vint is applied. In addition, a gate electrode of the fourth transistor T4 may be connected to a previous scan line, e.g., the (i−1)th scan line Si−1. The fourth transistor T4 may be turned on when a scan signal having a gate-on voltage is supplied from the (i−1)th scan line Si−1, to transfer a voltage of the initialization power source Vint to the first node N1. The initialization power source Vint may have a voltage equal to or smaller than the lowest voltage of the data signal.

The fifth transistor T5 may be connected between the first pixel power source ELVDD and the first transistor T1. In addition, a gate electrode of the fifth transistor T5 may be connected to a corresponding emission control line, e.g., an ith emission control line Ei. The fifth transistor T5 may be turned off when an emission control signal having a gate-off voltage is supplied from the ith emission control line Ei, and be turned on in other cases.

The sixth transistor T6 may be connected between the first transistor T1 and the light emitting element OLED. In addition, a gate electrode of the sixth transistor T6 may be connected to the ith emission control line Ei. The sixth transistor T6 may be turned off when an emission control signal having a gate-off voltage is supplied from the ith emission control line Ei, and be turned on in other cases.

The seventh transistor T7 may be connected between the light emitting element OLED and the initialization power line to which the initialization power source Vint is applied. In addition, a gate electrode of the seventh transistor T7 may be connected to any one of scan lines of a next stage, e.g., the (i+1)th scan line Si+1. The seventh transistor T7 may be turned on when a scan signal having a gate-on voltage is supplied from the (i+1)th scan line Si+1, to supply the voltage of the initialization power source Vint to the light emitting element OLED.

The storage capacitor Cst may be connected between the first pixel power source ELVDD and the first node N1. The storage capacitor Cst may store a data signal supplied to the first node in each frame period and a threshold voltage of the first transistor T1.

An anode electrode of the light emitting element OLED may be connected to the first transistor T1 via the sixth transistor T6, and a cathode electrode of the light emitting element OLED may be connected to the second pixel power source ELVSS. The light emitting element OLED may generate light with a predetermined luminance corresponding to an amount of current supplied from the first transistor T1. The first pixel power source ELVDD may be set to have a voltage higher than that of the second pixel power source ELVSS such that current can flow through the light emitting element OLED. A potential difference between the first pixel power source ELVDD and the second pixel power source ELVSS may be set to a threshold voltage or more of the light emitting element OLED during an emission period.

FIG. 3B is an enlarged sectional view illustrating a portion of the display panel shown in FIG. 2.

In FIG. 3B, only a section of a portion corresponding to each of the second and sixth transistors among the first to seventh transistors illustrated in FIG. 3A is illustrated for convenience of description.

Referring to FIGS. 1A to 3B, the display panel DP may include a substrate SUB, a pixel circuit layer PCL, a display element layer DPL, and a thin film encapsulation layer TFE.

The substrate SUB may include an insulative material such as glass, organic polymer or quartz. Also, the substrate SUB may be made of a material having flexibility to be bendable or foldable, and have a single- or multi-layered structure. The substrate SUB may have the same configuration as the substrate SUB described with reference to FIG. 2.

The pixel circuit layer PCL may include a buffer layer BFL, the second and sixth transistors T2 and T6, and a passivation layer PSV.

The buffer layer BFL may be provided on the substrate SUB, and prevent an impurity from being diffused into the second and sixth transistors T2 and T6. The buffer layer BFL may include an inorganic insulating layer including an inorganic material. In an example, the buffer layer BFL may include at least one of metal oxides such as silicon nitride ($SiN_x$), silicon oxide ($SiO_x$), silicon oxynitride (SiON), and aluminum oxide ($AlO_x$). The buffer layer BFL may be provided in a single layer or be provided in a multi-layer including at least two layers. When the buffer layer BFL is provided in the multi-layer, the layers may be formed of the same material or formed of different materials. The buffer layer BFL may be omitted according to the material and process conditions of the substrate SUB.

Each of the second and sixth transistors T2 and T6 may include a semiconductor layer SCL, a gate electrode GE, a source electrode SE, and a drain electrode DE.

The semiconductor layer SCL of each of the second and sixth transistors T2 and T6 may be provided on the buffer layer BFL. The semiconductor layer SCL may include source and drain regions respectively in contact with the source electrode SE and the drain electrode DE. A region between the source region and the drain region may be a channel region.

The semiconductor layer SCL may be a semiconductor pattern made of poly-silicon, amorphous silicon, oxide semiconductor, etc. The channel region is an intrinsic semiconductor pattern undoped with an impurity. The impurity may include impurities such as an n-type impurity, a p-type impurity, and other metals. Each of the source and drain regions may be a semiconductor pattern doped with the impurity.

The gate electrode GE of each of the second and sixth transistors T2 and T6 may be provided on a corresponding semiconductor layer SCL with a gate insulating layer GI interposed therebetween. In the transistor T2 to T6 regions, the gate insulating layer GI may be disposed on the semiconductor layer SCL. In other regions outside of the transistors T2 to T6, the gate insulating layer may be disposed directly on the buffer layer BFL.

The source electrode SE of each of the second and sixth transistors T2 and T6 may be in contact with the source region of a corresponding semiconductor layer SCL through a contact hole penetrating an interlayer insulating layer ILD and the gate insulating layer GI. In an example, the source electrode SE of the second transistor T2 may be in contact with the source region of a corresponding semiconductor layer SCL through a first contact hole CH1 penetrating the interlayer insulating layer ILD and the gate insulating layer GI, and the source electrode SE of the sixth transistor T6 may be in contact with the source region of a corresponding semiconductor layer SCL through a third contact hole CH3 penetrating the interlayer insulating layer ILD and the gate insulating layer GI.

The drain electrode DE of each of the second and sixth transistors T2 and T6 may be in contact with the drain region of a corresponding semiconductor layer SCL through a contact hole penetrating the interlayer insulating layer ILD and the gate insulating layer GI. In an example, the drain electrode DE of the second transistor T2 may be in contact with the drain region of a corresponding semiconductor layer SCL through a second contact hole CH2 penetrating the interlayer insulating layer ILD and the gate insulating layer GI, and the drain electrode DE of the sixth transistor T6 may be in contact with the drain region of a corresponding semiconductor layer SCL through a fourth contact hole CH4 penetrating the interlayer insulating layer ILD and the gate insulating layer GI.

In an embodiment of the inventive concepts, each of the interlayer insulating layer ILD and the gate insulating layer GI may be an inorganic insulating layer including an inorganic material. In an example, each of the interlayer insulating layer ILD and the gate insulating layer GI may include at least one of metal oxides such as silicon nitride ($SiN_x$), silicon oxide ($SiO_x$), silicon oxynitride (SiON), and aluminum oxide ($AlO_x$). In some embodiments, each of the interlayer insulating layer ILD and the gate insulating layer GI may be configured with an organic insulating layer including an organic material. Also, each of the interlayer insulating layer ILD and the gate insulating layer GI may be provided in a single layer, but be provided in a multi-layer including at least two layers.

The passivation layer PSV may be provided over the second and sixth transistors T2 and T6 to cover the second and sixth transistors T2 and T6. The passivation layer PSV may include a fifth contact hole CH5 through which a portion of the drain electrode DE of the sixth transistor T6 is exposed outside the passivation layer PSV. The passivation layer PSV may be configured with an organic insulating layer including an organic material. The organic insulating layer may include, for example, at least one of polyacrylates resin, epoxy resin, phenolic resin, polyamides resin, polyimides resin, unsaturated polyesters resin, poly-phenylene ethers resin, poly-phenylene sulfides resin, and benzocyclobutene resin.

The display element layer DPL may include a light emitting element OLED provided on the passivation layer PSV, the light emitting element OLED emitting light.

The light emitting element OLED may include first and second electrodes EL1 and EL2 and an emitting layer EML provided between the two electrodes EL1 and EL2. Any one of the first and second electrodes EL1 and EL2 may be an anode electrode, and the other of the first and second electrodes EL1 and EL2 may be a cathode electrode. For example, the first electrode EL1 may be the anode electrode, and the second electrode EL2 may be the cathode electrode. When the light emitting element OLED is a top-emission organic light emitting element, the first electrode EL1 may be a reflective electrode, and the second electrode EL2 may be a transmissive electrode. In an embodiment of the inventive concepts, a case where the light emitting element OLED is the top-emission organic light emitting element, and the first electrode EL1 is the anode electrode is described as an example.

The first electrode EL1 may be electrically connected to the drain electrode DE of the sixth transistor T6 through the fifth contact hole CH5 penetrating the passivation layer PSV. The first electrode EL1 may include a reflective layer (not illustrated) capable of reflecting light and a transparent conductive layer (not illustrated) disposed on the top or bottom of the reflective layer. At least one of the transparent conductive layer and the reflective layer may be electrically connected to the drain electrode DE of the sixth transistor T6.

The display element layer DPL may further include a pixel defining layer PDL having an opening OP through which a portion of the first electrode EL1, e.g., an upper surface of the first electrode EL1 is exposed.

Each pixel PXL provided in the display panel DP may be disposed in a pixel region included in the display region DA. In an embodiment of the inventive concepts, the pixel region may include an emission region EMA and a non-emission region NEMA adjacent to the emission region EMA. The non-emission region NEMA may surround the emission region EMA. In this embodiment, the emission region EMA may be defined corresponding to a partial region of the first electrode EL1, which is exposed by the opening OP.

The display element layer DPL may include a hole control layer HCL and an electron control layer ECL.

The hole control layer HCL may be commonly disposed in the emission region EMA and the non-emission region NEMA. Although not separately illustrated in the drawing, a common layer such as the hole control layer HCL may be formed in a plurality of pixels PXL.

The emitting layer EML is disposed on the hole control layer HCL. The emitting layer EML may be disposed in a region corresponding to the opening OP. That is, the emitting layer EML may be separated to be respectively provided in a plurality of pixels PXL. The emitting layer EML may include an organic material and/or an inorganic material. In an embodiment of the inventive concepts, a patterned emitting layer EML is exemplarily illustrated. However, in some embodiments, the emitting layer EML may be commonly provided in the pixels PXL. The color of light generated in the emitting layer EML may be one of red, green, blue, and white, but this embodiment is not limited thereto. For example, the color of light generated in the emitting layer EML may be one of magenta, cyan, and yellow.

The electron control layer ECL may be provided on the emitting layer EML. The electron control layer ECL may be commonly formed in the pixels PXL, and function to inject and/or transport electrons into the emitting layer EML.

The second electrode EL2 may be provided on the electron control layer ECL. The second electrode EL2 may be commonly provided in the pixels PXL.

The thin film encapsulation layer TFE covering the second electrode EL2 may be provided over the second electrode EL2.

The thin film encapsulation layer TFE may be provided in a single layer, but be provided in a multi-layer. The thin film encapsulation layer TFE may include a plurality of insulating layers covering the light emitting element OLED. Specifically, the thin film encapsulation layer TFE may include at least one inorganic layer and at least one organic layer. For example, the thin film encapsulation layer TFE may have a structure in which the inorganic and organic layers are alternately stacked. In some embodiments, the thin film encapsulation layer TFE may be an encapsulation substrate which is disposed over the light emitting element OLED and is joined with the substrate through a sealant.

FIG. 4 is a schematic sectional view illustrating a touch sensor shown in FIG. 1B.

Referring to FIGS. 1A to 4, the touch sensor TS may include a base layer BSL, a first conductive pattern CP1, a first insulating layer INS1, a second conductive pattern CP2, and a second insulating layer INS2.

The first conductive pattern CP1 may be directly disposed on the thin film encapsulation layer TFE of the display panel DP, but the inventive concepts are not limited thereto. In some embodiments, another insulating layer, e.g., the base layer BSL may be disposed between the first conductive pattern CP1 and the thin film encapsulation layer TFE. The first conductive pattern CP1 may be directly disposed on the base layer BSL.

Each of the first and second conductive patterns CP1 and CP2 may have a single-layered structure, or have a multi-layered structure in which layers are stacked in the thickness direction thereof. The conductive pattern having the single-layered structure may include a metal layer or a transparent conductive layer. The metal layer may include molybdenum, silver, titanium, copper, aluminum, and alloys thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include PEDOT, metal nano wire, and graphene.

The conductive pattern having the multi-layered structure may include multi-layered metal layers. The multi-layered metal layers may have, for example, a triple layered structure of titanium/aluminum/titanium. The conductive pattern having the multi-layered structure may include a single-layered metal layer and a transparent conductive layer. The conductive pattern having the multi-layered structure may include multi-layered metal layers and a transparent conductive layer.

In an embodiment of the inventive concepts, each of the first and second conductive patterns CP1 and CP2 may include sensor patterns and sensing lines.

The first and second insulating layers INS1 and INS2 may include an inorganic insulating layer including an inorganic material or an organic insulating layer including an organic material. The inorganic insulating layer may include at least one of aluminum oxide, titanium oxide, silicon oxide or silicon nitride, silicon oxynitride, zirconium oxide, and hafnium oxide. The organic insulating layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

FIG. 5 is a schematic plan view illustrating the touch sensor shown in FIG. 1B. FIG. 6A is an enlarged plan view schematically illustrating an example of portion EA shown in FIG. 5. FIG. 6B is a sectional view taken along line II-II' shown in FIG. 6A. FIG. 6C is a sectional view taken along line I-I' shown in FIG. 5.

Referring to FIGS. 1A to 6C, the touch sensor TS may include a base layer BSL including a sensing region SA capable of sensing a touch input and a non-sensing region NSA surrounding at least a portion of the sensing region SA.

The base layer BSL may be formed of tempered glass, a transparent plastic, a transparent film, or the like. In some embodiments, the base layer BSL may be omitted.

The sensing region SA may be provided in a central region of the base layer BSL to overlap with the display region DA of the display panel DP. The sensing region SA may be provided in a shape substantially identical to that of the display region DA, but the inventive concepts are not limited thereto. A sensor electrode configured to sense a touch input may be provided and/or formed in the sensing region SA.

The non-sensing region NSA may be provided at an edge of the base layer BSL to overlap with the non-display region NDA of the display panel DP. Sensing lines SL electrically connected to the sensor electrode configured to receive and transfer a sensing signal may be provided and/or formed in the non-sensing region NSA. In addition, a pad unit PDA connected to the sensing lines SL electrically connected to the sensor electrode of the sensing region SA may be disposed in the non-sensing region NSA. The pad unit PDA may include a plurality of pads PD.

The sensor electrode may include a plurality of sensor patterns SP and first and second bridge patterns BRP1 and BRP2.

The sensor patterns SP may include a plurality of first sensor patterns SP1 and a plurality of second sensor patterns SP2 electrically insulated from the first sensor patterns SP1.

The first sensor patterns SP1 may arranged in a first direction DR1, and be electrically connected to adjacent first sensor patterns SP1 by the first bridge patterns BRP1 to constitute at least one sensor row. The second sensor patterns SP2 may be arranged in a second direction DR2 intersecting the first direction DR1, and be electrically connected to adjacent second sensor patterns SP2 by the second bridge patterns BRP2 to constitute at least one sensor column.

Each of the first and second sensor patterns SP1 and SP2 may be electrically connected to one pad PD through a corresponding sensing line SL.

The first sensor patterns SP1 may correspond to a driving electrode which receives a driving signal to detect a touch position in the sensing region SA, and the second sensor patterns SP2 may correspond to a sensing electrode which outputs a sensing signal to detect a touch position in the sensing region SA. However, the inventive concepts are not limited thereto. The first sensor patterns may correspond to the sensing electrode, and the second sensor patterns may correspond to the driving electrode.

In an embodiment of the inventive concepts, the touch sensor TS may recognize a touch of a user by sensing a variation in mutual capacitance formed between the first and second sensor patterns SP1 and SP2.

In an embodiment of the inventive concepts, each of the second sensor patterns SP2 may have a mesh structure including a plurality of conductive fine lines.

Each of the first bridge patterns BRP1 is used to electrically connect first sensor patterns SP1 arranged in parallel to each other along the first direction DR1, and may be provided in a shape extending along the first direction DR1. Each of the first bridge patterns BRP1 may include a (1-1)th bridge pattern BRP1_1 and a (1-2)th bridge pattern BRP1_2. Each of the first bridge pattern BRP1 may have a chevron shape, one mirroring the other between connection points on respective first sensor patterns SP1.

Each of the second bridge patterns BRP2 is used to electrically connect second sensor patterns SP2 arranged in parallel to each other along the second direction DR2, and may be provided in a shape extending along the second direction DR2. The shape of the second bridge patterns BRP2 may be an island or strip between respective second sensor patterns SP2. In an embodiment of the inventive concepts, each of the second bridge patterns BRP2 may be integrally provided with second sensor patterns SP2. When each of the second bridge patterns BRP2 is integrally provided with second sensor patterns SP2, the second bridge pattern BRP2 may be one region of the second sensor patterns SP2.

The touch sensor TS may include a first conductive pattern (see CP1 illustrated in FIG. 4) provided on the base layer BSL, a first insulating layer INS1 provided over the first conductive pattern CP1, a second conductive pattern (see CP2 illustrated in FIG. 4) provided on the first insulating layer INS1, and a second insulating layer INS2 provided over the second conductive pattern CP2.

The base layer BSL may be provided on the thin film encapsulation layer TFE of the display panel DP. The base layer BSL may include a first base layer BSL1 and a second base layer BSL2, which are sequentially stacked. Each of the first base layer BSL1 and the second base layer BSL2 may be an inorganic insulating layer including an inorganic material. In an example, each of the first base layer BSL1 and the second base layer BSL2 may be an inorganic insulating layer including silicon nitride ($SiN_x$). The first base layer BSL1 and the second base layer BSL2 may have different thicknesses, but the inventive concepts are not limited thereto. In some embodiments, the first base layer BSL1 and the second base layer BSL2 may have the same thickness.

In some embodiments, the first base layer BSL1 may be an uppermost layer of the thin film encapsulation layer TFE of the display panel DP. For example, the first base layer BSL1 may be an inorganic insulating layer (or inorganic layer) as the uppermost layer of the thin film encapsulation layer TFE. In some embodiments, the first base layer BSL1 may be an inorganic insulating layer (inorganic buffer layer) additionally disposed on the thin film encapsulation layer TFE.

The first conductive pattern CP1 may be directly disposed on the base layer BSL. In some embodiments, the first conductive pattern CP1 may be disposed to overlap with the pixel defining layer PDL. In an embodiment of the inventive concepts, the first conductive pattern CP1 may include the first bridge patterns BRP1.

The first conductive pattern CP1 may include a conductive material. The conductive material may include a transparent conductive oxide or a metallic material. Also, the first conductive pattern CP1 may include a plurality of stacked metal layers. Examples of the transparent conductive oxide may be Indium Tin Oxide (ITO), Indium Zinc Oxide (IZO), Antimony Zinc Oxide (AZO), Indium Tin Zinc Oxide (ITZO), Zinc Oxide (ZnO), tin oxide ($SnO_2$), and the like. Examples of the metallic material may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. The first conductive pattern CP1 may have a single- or multi-layered structure.

The first insulating layer INS1 may be provided and/or formed on the first conductive pattern CP1. The first insulating layer INS1 may include the same material as the base layer BSL, but the inventive concepts are not limited thereto. In an embodiment of the inventive concepts, the first insulating layer INS1 may include an organic insulating layer including an organic material or an inorganic insulating layer including an inorganic material. The first insulating layer INS1 is the same component as the first insulating layer INS1 described with reference to FIG. 4, and therefore, its detailed description will be omitted.

Like the first conductive pattern CP1, the second conductive pattern CP2 may include a single conductive material layer, or include a plurality of stacked conductive material layers. The second conductive pattern CP2 may include the first and second sensor patterns SP1 and SP2 provided on the first insulating layer INS1. Also, the second conductive pattern CP2 may include the second bridge patterns BRP2 integrally provided with the second sensor patterns SP2 to connect the second sensor patterns SP2.

First sensor patterns SP1 adjacent in the first direction DR1 may be electrically and/or physically connected to each other by contact holes CNT penetrating the first insulating layer INS1 and the first bridge patterns BRP1.

The second insulating layer INS2 may be provided on the first insulating layer INS1 on which the second conductive pattern CP2. The second insulating layer INS2 may prevent corrosion of the second conductive pattern CP2 by preventing the second conductive pattern CP2 from being exposed to the outside. The second insulating layer INS2 may be configured with an organic insulating layer made of an organic material. The organic material may include one of acryl, polyimide (PI), polyamide (PA), and benzocyclobutene (BCB). Because the second insulating layer INS2 configured with the organic layer is transparent and flexible, the second insulating layer INS2 may reduce and planarize winding of a lower structure. In some embodiments, the second insulating layer INS2 may be configured with an inorganic insulating layer including an inorganic material.

In the above-described embodiment, a case where the first bridge patterns BRP1 are included in the first conductive pattern CP1, and the first and second sensor patterns SP1 and SP2 and the second bridge patterns BRP2 are included in the second conductive pattern CP2 is described as an example, but the inventive concepts are not limited thereto. In some embodiments, the first and second sensor patterns SP1 and SP2 and the second bridge patterns BRP2 may be included in the first conductive pattern CP1, and the first bridge patterns BRP1 may be included in the second conductive pattern CP2.

Also, in the above-described embodiment, a case where the first conductive pattern CP1 is provided on the base layer BSL, and the second conductive pattern CP2 is provided on the first insulating layer INS1 is described as an example, the inventive concepts are not limited thereto. In some embodiments, the first conductive pattern CP1 may be provided on the first insulating layer INS1, and the second conductive pattern CP2 may be provided on the base layer BSL.

Also, in the above-described embodiment, a case where the first and second sensor patterns SP1 and SP2 are provided in the same layer is described as an example, but the inventive concepts are not limited thereto. In some embodiments, the first sensor patterns SP1 and the second sensor patterns SP2 may be provided in different layers.

The sensor electrode provided and/or formed in the sensing region SA may include dummy electrodes (not illustrated) disposed to be spaced apart from each other between the first and second sensor patterns SP1 and SP2. The dummy electrodes are floating electrodes, and are not electrically connected to the first sensor patterns SP1 and the second sensor patterns SP2. The dummy electrodes are disposed in the sensing region SA, so that a boundary region between the first sensor patterns SP1 and the second sensor patterns SP2 is not viewed. Further, a fringe effect between the first sensor patterns SP1 and the second sensor patterns SP2 can be controlled by adjusting the width and thickness of the dummy electrodes, and capacitance between the first sensor patterns SP1 and the second sensor patterns SP2 can be optimized.

The touch sensor TS may be formed through repeated arrangement of a unit sensor block USB as illustrated in FIGS. 5 and 6A. The unit sensor block USB may be a virtual unit block with a predetermined area, which includes at least some of sensor patterns SP adjacent in the first direction DR1 and at least some of sensor patterns SP adjacent in the second direction DR2 in a corresponding sensing region. It will be understood that the unit sensor block USB corresponds to a minimum repetition unit of the arrangement of the sensor patterns SP in the corresponding sensing region.

In an embodiment of the inventive concepts, the sensing lines SL may include a plurality of first sensing lines SL1 connected to the first sensor patterns SP1 and a plurality of second sensing lines SL2 connected to the second sensor patterns SP2.

The first sensing lines SL1 may be connected to the first sensor patterns SP1. Each of the first sensing lines SL1 may be connected to one sensor row which a plurality of first sensor patterns SP1 arranged along the first direction DR1 constitute.

The second sensing lines SL2 may be connected to the second sensor patterns SP2. Each of the second sensing lines SL2 may be connected to one sensor column which a plurality of second sensor patterns SP2 arranged along the second direction DR2 constitute.

The first and second sensing lines SL1 and SL2 may be made of a conductive material. The conductive material may include metals, alloys thereof, conductive polymer, conductive metal oxide, a nano conductive material, and the like. In an embodiment of the inventive concepts, examples of the metals may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. Examples of the conductive polymer may be a polythiophene-based compound, a polypyrrole-based compound, a polyaniline-based compound, a polyacetylene-based compound, a polyphenylene-based compound, mixtures thereof, etc. In particular, a PEDOT/PSS compound may be used as the polythiophene-based compound. Examples of the conductive metal oxide may be Indium Tin Oxide (ITO), Indium Zinc Oxide (IZO), Antimony Zinc Oxide (AZO), Indium Tin Zinc Oxide (ITZO), Zinc Oxide (ZnO), tin oxide ($SnO_2$), and the like. In addition, examples of the nano conductive material may be a silver nano-wire (AgNW), a carbon nano-tube, grapheme, and the like.

In an embodiment of the inventive concepts, the first sensing lines SL1 may be configured in a double layer including a first metal layer MTL1 included in the first conductive pattern CP1 and a second metal layer MTL2 included in the second conductive pattern CP2 as illustrated in FIG. 6C. The second metal layer MTL2 may be provided and/or formed on the first metal layer MTL1 with the first insulating layer INS1 interposed therebetween. The first metal layer MTL1 and the second metal layer MTL2 may overlap with each other. The first metal layer MTL1 and the second metal layer MTL2 may be electrically connected to each other through a contact hole penetrating the first insulating layer INS1.

Although a case where each of the first sensing lines SL1 is configured in the double layer including the first metal layer MTL1 and the second metal layer MTL2 has been described in the above-described embodiment, the inventive concepts are not limited thereto. Although not directly illustrated in the drawings, each of the second sensing lines SL2 may also be configured in a double layer including one metal layer included in the first conductive pattern CP1 and another metal layer included in the second conductive pattern CP2.

Each of the first sensor patterns SP1 may be supplied with a driving signal configured to sense touch through a corresponding first sensing line SL1, and each of the second sensor patterns SP2 may transfer a touch sensing signal through a corresponding second sensing line SL2. However, the inventive concepts are not limited thereto, and the opposite case is possible.

FIG. 7 is a plan view illustrating a display device in accordance with an embodiment of the inventive concepts. FIG. 8 is a sectional view taken along line III-III' shown in FIG. 7. FIG. 9 is a sectional view taken along line IV-IV' shown in FIG. 7. FIG. 10 is a sectional view taken along line V-V' shown in FIG. 7. FIG. 11 illustrates an intermediate layer shown in FIG. 10 in another form, which is a sectional view corresponding to the line V-V' shown in FIG. 7. FIGS. 12A and 12B illustrate a cover layer shown in FIG. 10 in another form, which are sectional views corresponding to the line V-V' shown in FIG. 7. FIG. 7 illustrates, on one plane, additional components of a display panel DP, as compared with the display panel DP shown in FIG. 2, and components of a touch sensor TS.

Although a structure of the display device DD is simplified and illustrated in FIGS. 7 to 12B, such as a case where each electrode is illustrated as only a single electrode layer and a case where each insulating layer is illustrated as only a single insulating layer, the inventive concepts are not limited thereto.

In an embodiment of the inventive concepts, the term "formed and/or provided in the same layer" may mean formation in the same process, and the term "formed and/or provided in different layers" may mean formation in different processes.

In relation to the display device illustrated in FIGS. 7 to 12B, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIGS. 7 to 12B, the display device DD in accordance with the embodiment of the inventive concepts may include a display panel DP and a touch sensor TS. Although not separately illustrated in the drawings, the display device DD may further include a window.

The display device DD may include a display region DD_DA configured to display an image and a non-display region DD_NDA provided adjacent at least one side of the display region DD_DA. The display region DD_DA may correspond to a sensing region SA of the touch sensor TS, and the non-display region DD_NDA may correspond to a non-sensing region NSA of the touch sensor TS. In an embodiment of the inventive concepts, the display region DD_DA may be the display region (see DA illustrated in FIG. 2) of the display panel DP, and the non-display region DD_NDA may be the non-display region (see NDA illustrated in FIG. 2) of the display panel DP.

At least a portion of the display device DD may have flexibility, and the display device DD may be folded at a portion having flexibility. However, the inventive concepts are not limited thereto.

Pixels (see PXL illustrated in FIG. 2) and a sensor electrode may be disposed in the display region DD_DA. A driver, a pad unit PDA, and sensing lines SL may be disposed in the non-display region DD_NDA.

In an embodiment of the inventive concepts, the pad unit PDA may include at least one first pad PD1 electrically connected to the touch sensor TS and at least one second pad PD2 electrically connected to the display panel DP. In an example, the first pad PD1 may be connected to each sensing line SL, and the second pad PD2 may be connected to each of data lines (not illustrated) included in the display panel DP. In an example, the second pad PD2 may be electrically and/or physically connected to a corresponding data line through a fan-out line FOL provided in the non-display region DD_NDA. The fan-out line FOL may be integrally provided with a corresponding data line, e.g., a jth data line Dj (j is a natural number of 1 or more) or may not be integrally provided with the corresponding data line.

Each of the first and second pads PD1 and PD2 may be configured with a second conductive pattern (see CP2 illustrated in FIG. 4). A second insulating layer INS2 provided over the first and second pads PD1 and PD2 to cover the first and second pads PD1 and PD2 may include an opening exposing each of the first and second pads PD1 and PD2 to the outside. Each of the exposed first and second pads PD1 and PD2 may be in contact with an external IC.

The display device DD may further include a dam part DMP which is provided in the display panel DP and is located in the non-display region DD_NDA. The dam part DMP may extend along an edge of the display region DD_DA.

The dam part DMP may include a first dam part DMP1 and a second dam part DMP2. The first dam part DMP1 may surround the display region DD_DA. The second dam part DMP2 may be disposed at an outer side of the first dam part DMP1. Although the second dam parts DMP2 may have two groups, which are spaced apart from each other along a first direction DR1, as illustrated in FIG. 7, the inventive concepts are not limited thereto.

As illustrated in FIG. 9, the first dam part DMP1 may have a multi-layered structure. A lower portion DMP1a may be simultaneously formed with a passivation layer PSV, and an upper portion DMP1b may be simultaneously formed with a pixel defining layer PDL. The first dam part DMP1 may prevent a liquid organic material from flowing outward of inorganic insulating layers, e.g., a gate insulating layer GI and an interlayer insulating layer ILD in a process of forming an organic layer included in a thin film encapsulation layer TFE.

The second dam part DMP2 may be configured with an inorganic layer including an inorganic material. When an impact is applied to an edge of the display device DD from the outside, the second dam part DMP2 may absorb the impact while being broken. Accordingly, the second dam part DMP2 can prevent an external impact from being transferred to the display region DD_DA.

The display panel DP may include a substrate SUB, a pixel circuit layer PCL provided on the substrate SUB, a display element layer DPL provided on the pixel circuit layer PCL, and the thin film encapsulation layer TFE covering the whole of the substrate SUB on which the display element layer DPL. The display panel DP may be the same component as the display panel DP described with reference to FIGS. 2 to 3B.

A plurality of insulating layers and a plurality of conductive layers may be disposed on the substrate SUB. In an example, the insulating layers may include a buffer layer BFL, the gate insulating layer GI, the interlayer insulating layer ILD, the passivation layer PSV, and the pixel defining layer PDL. The insulating layers may be commonly provided in a display region DA and a non-display region NDA of the substrate SUB. The conductive layers may be provided and/or formed between the insulating layers.

As illustrated in FIGS. 8 and 9, the pixel circuit layer PCL may include the buffer layer BFL, at least one transistor Tdr and TSW provided on the buffer layer BFL, signal lines connected to the transistor Tdr and TSW, and the passivation layer PSV provided over the signal lines and the transistor Tdr and TSW. The signal lines may correspond to a component electrically connected to the transistor Tdr and TSW to transfer a predetermined signal (or predetermined voltage) to each pixel PXL.

The transistor Tdr and TSW may include a driving transistor Tdr configured to drive a light emitting element OLED included in the display element layer DPL and a switching transistor TSW configured to switch the driving transistor Tdr. Each of the driving transistor Tdr and the switching transistor TSW may include a semiconductor layer SCL, a gate electrode GE, a source electrode SE, and a drain electrode DE. In an embodiment of the inventive concepts, the driving transistor Tdr may be the same component as the first transistor T1 described with reference to FIG. 3A, and the switching transistor TSW may be the same configuration as the second transistor T2 described with reference to FIGS. 3A and 3B. Therefore, a detailed description of the driving transistor Tdr and the switching transistor TSW will be omitted.

The pixel circuit layer PCL may include the driver provided in the non-display region DD_NDA, e.g., the scan driver SDV, the emission driver EDV, and the data driver DDV, which are illustrated in FIG. 2. The driver may include at least one driver transistor (not illustrated) formed through the same process as the driving transistor Tdr and/or the switching transistor TSW. Also, the driver may include driving signal lines (not illustrated) electrically and/or physically connected to the driver transistor.

The display element layer DPL may include the pixel defining layer PDL and the light emitting element OLED. As illustrated in FIG. 8 the light emitting element OLED may include a first electrode EL1, an emitting layer EML, and a second electrode EL2.

As illustrated in FIGS. 8 and 9, the thin film encapsulation layer TFE may include a first encapsulation layer ENC1 located throughout the display region DD_DA and the non-display region DD_NDA, a second encapsulation layer ENC2 which is located on the first encapsulation layer ENC1 and is located throughout the display region DD_DA and at least a portion of the non-display region DD_NDA, and a third encapsulation layer ENC3 which is located on the second encapsulation layer ENC2 and is located throughout the display region DD_DA and at least a portion of the non-display region DD_NDA. In some embodiments, the third encapsulation layer ENC3 may be located throughout the whole of the display region DD_DA and the non-display region DD_NDA.

The first and third encapsulation layers ENC1 and ENC3 may be configured with an inorganic layer including an inorganic material, and the second encapsulation layer ENC2 may be configured with an organic layer including an organic material.

The touch sensor TS may include a base layer BSL, first and second insulating layers INS1 and INS2, the sensor electrode, and the sensing lines SL. The touch sensor TS corresponds to the same configuration as the touch sensor TS described with reference to FIGS. 5 to 6C, and therefore, a detailed description of this will be omitted.

The sensor electrode may include a plurality of first bridge patterns BRP1 included in a first conductive pattern (see CP1 illustrated in FIG. 4) and a plurality of sensor patterns SP and a plurality of second bridge patterns BRP2, which are included in a second conductive pattern (see CP2 illustrated in FIG. 4). The sensor patterns SP may include a plurality of first sensor patterns SP1 and a plurality of second sensor patterns SP2, which are electrically insulated from each other.

The sensing lines SL may include first sensing lines SL1 electrically and/or physically connected to the first sensor patterns SP1 and second sensing lines SL2 electrically and/or physically connected to the second sensor patterns SP2.

As illustrated in FIG. 7, display device DD in accordance with an embodiment of the inventive concepts may further include a dummy pad unit DPDA provided and/or formed on at least one region of the non-display region DD_NDA.

The dummy pad unit DPDA may be provided and/or formed on at least one region of the non-display region NDA of the substrate SUB included in the display panel DP. The dummy pad unit DPDA may include at least one test pad TE_PD.

The test pad TE_PD may be electrically connected to an element which becomes a target to be tested in the display panel DP through a connection line (not illustrated) to determine whether a defect has occurred in the element. In an example, the test pad TE_PD may be electrically connected to signal lines disposed in the display region DA of the display panel DA. Specifically, the test pad TE_PD may be electrically connected to, for example, scan lines and/or emission control lines, which are applied with the same signal among the signal lines disposed in the display region DA of the display panel DP to determine whether a defect has occurred in the scan lines and/or the emission lines. However, the inventive concepts are not limited to the above-described embodiment. In some embodiments, the test pad TE_PD may be electrically connected to data lines applied with different signals to determine whether a defect has occurred in the data lines.

A test signal (or test voltage) may be supplied to the test pad TE_PD. In an example, the test signal (or test voltage) may be an electrical signal having the same level as one of a scan signal, an emission control signal, and a data signal, but the inventive concepts are not limited thereto. The test pad TE_PD may be provided in the same layer as some components included in the display panel DP, and be formed through the same process as the some components. In an example, the test pad TE_PD may be provided in the same layer as a jth data line Dj, and be formed through the same process as the jth data line Dj. The test pad TE_PD may be provided and/or formed on the interlayer insulating layer ILD.

The passivation layer PSV and the pixel defining layer PDL may be provided and/or formed on the test pad TE_PD.

As illustrated in FIG. 10, for example, the passivation layer PSV may include a first opening OP1 exposing one region of the test pad TE_PD. The pixel defining layer PDL may include a second opening OP2 which corresponds to the first opening OP1 and exposes a region of the test pad TE_PD. The first opening OP1 may be formed through the same process as a contact hole exposing one region of the drain electrode DE of the driving transistor Tdr located in the display region DD_DA. The second opening OP2 may be formed through the same process as an opening OP exposing one region of the first electrode EL1 of the light emitting element OLED.

As illustrated in FIG. 10, both side surfaces of the first opening OP1 (or both end portions of the passivation layer PSV) and both side surfaces of the second opening OP2 (or both end portions of the pixel defining layer PDL) may not be located on the same line. A size (or area) of the first opening OP1 and a size (or area) of the second opening OP2 may be different from each other. In an example, a width W1 of the first opening OP1 may be smaller than that W2 of the second opening OP2 when viewed on a section. That is, the width W2 of the second opening OP2 may be greater than that W1 of the first opening OP1.

Both the side surfaces of the first opening OP1 (or both the end portions of the passivation layer PSV) may be located inward of both the side surfaces of the second opening OP2 (or both the end portions of the pixel defining layer PDL) on the test pad TE_PD. In an example, both the side surfaces of the second opening OP2 (or both the end portions of the pixel defining layer PDL) may be located more adjacent to both end portions EP of the test pad TE_PD in the thickness direction DR3 than both the side surfaces of the first opening OP1 (or both the end portions of the passivation layer PSV).

As described above, when the passivation layer PSV and the pixel defining layer PDL are designed such that the width W2 of the second opening OP2 is greater than that W1 of the first opening OP1 on the test pad TE_PD, the passivation layer PSV and the pixel defining layer PDL may have a step difference. That is, an upper structure of the test pad TE_PD may be provided in a step shape having a step difference.

The test pad TE_PD exposed by the first and second openings OP1 and OP2 may be in contact with a probe (not illustrated) of a testing apparatus to be supplied with a signal to test a defect of the display region DD_DA. The test pad TE_PD may transfer the signal to an element which becomes a target to be tested in the display region DD_DA through a connection line (not illustrated).

A first base layer BSL1 may be provided and/or formed on the pixel defining layer PDL including the second opening OP2. The first base layer BSL1 may be an inorganic insulating layer including an inorganic material. In an example, the first base layer BSL1 may be silicon nitride ($SiN_x$). The first base layer BSL1 may have a thickness of 500 Å or so, and have a dielectric constant of approximately 7.1ε or so. However, the inventive concepts are not limited thereto. The first base layer BSL1 may be the same component as the first base layer BSL1 located in the display region DD_DA.

An intermediate layer CTL may be provided and/or formed on the first base layer BSL1. The intermediate layer CTL may be an organic insulating layer including an organic material. For example, the organic insulating layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin. The intermediate layer CTL may have a thickness of 25000 Å or so, and have a dielectric constant of approximately 3ε or so. However, the inventive concepts are not limited thereto.

In an embodiment of the inventive concepts, the intermediate layer CTL may be provided and/or formed in at least one region of the non-display region DD_NDA. The intermediate layer CTL may be provided in shape filling the first and second openings OP1 and OP2 on the first base layer BSL on the test pad TE_PD to compensate for a step difference caused by the first and second openings OP1 and OP2. As described above, because the upper structure of the test pad TE_PD is provided in a step shape, formation of the intermediate layer CTL in the first and second openings OP1 and OP2 can further secure an area of the test pad TE_PD within the display panel DP in which the intermediate layer CTL is in contact with the first base layer BSL1. Although the intermediate layer CTL is influenced by subsequent processes performed after the intermediate layer CTL is formed, an area with which the intermediate layer CTL and a component (e.g., the first base layer BSL1) disposed on the bottom of the intermediate layer CTL are in contact with each other is secured, so that a failure in which the intermediate layer CTL is separated can be reduced. The security between the first base layer BSL1 and the intermediate layer CTL may be enhanced by a bond between an inorganic base layer BSL1 and the organic intermediate layer CTL.

Both end portions EP1 of the intermediate layer CTL and both the end portions of the pixel defining layer PDL may not be located on the same line. In an example, both the end portions EP1 of the intermediate layer CTL and both the end portions (adjacent the opening OP2) of the pixel defining layer PDL may be located to be spaced apart from each other at a certain distance. When both the end portions EP1 of the intermediate layer CTL, both the end portions of the pixel defining layer PDL, and both the end portions (adjacent the opening OP1) of the passivation layer PSV are spaced apart from each other at a certain distance, the step difference of the upper structure of the test pad TE_PD may form a gentle step shape, as compared with when both the end portions EP1 of the intermediate layer CTL, both the end portions of the pixel defining layer PDL, and both the end portions of the passivation layer PSV are located on the same line. Accordingly, a failure which may occur due to a sharp step difference of the upper structure of the test pad TE_PD can be reduced.

Although a case where the first base layer BSL1 is provided and/or formed between the test pad TE_PD and the intermediate layer CTL has been described in the above-described embodiment, the inventive concepts are not limited thereto. In some embodiments, the first base layer BSL1 may be omitted as illustrated in FIG. 11. Therefore, the test pad TE_PD exposed by the first and second openings OP1 and OP2 and the intermediate layer CTL may be in direct contact with each other.

Also, although a case where the test pad TE_PD is provided on the interlayer insulating layer ILD, so that one region of the test pad TE_PD is exposed by the first opening OP1 of the passivation layer PSV located on the top of the interlayer insulating layer ILD and the second opening OP2 of the pixel defining layer PDL has been described in the above-described embodiment, the inventive concepts are not limited thereto, and the position of the test pad TE_PD may be variously changed. In an example, the test pad TE_PD may be provided on the gate insulating layer GI. Therefore, the interlayer insulating layer ILD located on the top of the gate insulating layer GI may include an opening exposing one region of the test pad TE_PD.

A second base layer BSL2 may be provided and/or formed on the intermediate layer CTL. The second base layer BSL2 may be an inorganic insulating layer including an inorganic material. In an example, the second base layer BSL2 may be silicon nitride ($SiN_x$). The second base layer BSL2 may have a thickness of 1500 Å or so, and have a dielectric constant of approximately 7.1ε or so. However, the inventive concepts are not limited thereto. The second base layer BSL2 may be the same component as the second base layer BSL2 located in the display region DD_DA. The second base layer BSL2 along with the first base layer BSL1 may constitute the base layer BSL.

A cover layer CVL may be provided and/or formed over the second base layer BSL2. The cover layer CVL may be made of a material different from that of the intermediate layer CTL. In an example, the cover layer CVL may be made of a conductive material. The cover layer CVL may be formed through the same process as a partial configuration of the sensor electrode of the touch sensor TS disposed in the display region DD_DA. In an example, the cover layer CVL may be formed through the same process as the first bridge patterns BRP1. That is, the cover layer CVL may be configured with the first conductive pattern CP1.

In an embodiment of the inventive concepts, the cover layer CVL may be designed in a shape completely covering the intermediate layer CTL, to be provided and/or formed over the second base layer BSL2. Each of both end portions EP2 of the cover layer CVL may be spaced apart from each of both the end portions EP1 of the intermediate layer CTL at a certain distance d. Each of both the end portions EP2 of the cover layer CVL may be located outward of each of both the end portions EP1 of the intermediate layer CTL. The cover layer CVL may protect the intermediate layer CTL located on the bottom thereof from subsequent processes performed after the cover layer CVL is formed. In an example, the cover layer CVL protects the intermediate layer CTL from an etching gas used when the second conductive pattern CP2 of the touch sensor TS is formed after the cover layer CVL is formed, so that a failure in which the intermediated layer CTL could be separated from the display panel DP and touch screen TS may be prevented.

The first insulating layer INS1 may be provided and/or formed on the cover layer CVL. The first insulating layer INS1 may be the same component as the first insulating layer INS1 provided over the first bridge patterns BRP1 in the display region DD_DA.

The second insulating layer INS2 may be provided and/or formed on the first insulating layer INS1. The second insulating layer INS2 may be the same component as the second insulating layer INS2 provided over the sensor patterns SP configured with the second conductive pattern CP2 and the second bridge patterns BRP2 in the display region DD_DA.

Although a case where the cover layer CVL has a single layered structure provided in the same layer as the first bridge patterns BRP1 has been described in the above-described embodiment, the inventive concepts are not limited thereto.

In some embodiments, as illustrated in FIGS. 12A and 12B, the cover layer CVL may have a multi-layered structure including a first cover layer CVL1 and a second cover layer CVL2. The first cover layer CVL1 may be provided and/or formed on the same layer as the cover layer CVL, e.g., the second base layer BSL2. The second cover layer CVL2 may be provided and/or formed over the first cover layer CVL1 with the first insulating layer INS1 interposed therebetween. The second cover layer CVL2 may be provided and/or formed in the same layer as the first and second sensor patterns SP1 and SP2 configured with the second conductive pattern CP2 in the sensor electrode of the display region DD_DA and the second bridge patterns BRP2. That is, the second cover layer CVL2 may be formed through the same process as the first and second sensor patterns SP1 and SP2 and the second bridge patterns BRP2.

In an embodiment of the inventive concepts, the second cover layer CVL2 may be designed in a shape completely covering the first cover layer CVL1, to be provided and/or formed on the first insulating layer INS1. Each of both the end portions EP1 of the intermediate layer CTL may be spaced apart from each of both end portions EP2 of the first cover layer CVL1 at a certain distance d1. In an example, each of both the end portions EP2 of the first cover layer CVL1 may be located outward of each of both the end portions EP1 of the intermediate layer CTL.

In addition, each of both the end portions EP2 of the first cover layer CVL1 may be spaced apart from each of both end portions EP3 of the second cover layer CVL2 at a certain distance d2. The distance d2 may be smaller than the distance d1. In an example, each of both the end portions EP3 of the second cover layer CVL2 may be located outward of each of both the end portions EP2 of the first cover layer CVL1.

As illustrated in FIG. 12B, the first cover layer CVL1 may have both end portions EP2 located at a portion surrounding each of both the end portions EP1 of the intermediate layer CTL and each of both end portions of the second base layer BSL2. While the end portion EP2 touches the first base layer BSL1, the end portion EP2 in this embodiment does not extend along the first base layer BSL1.

In some embodiments, as illustrated in FIG. 12A, the intermediate layer CTL may have both end portions EP2 extending from the portion surrounding each of both the end portions EP1 of the intermediate layer CTL along the first base layer BSL1 and each of both the end portions of the second base layer BSL2 to be located in one region of an upper surface of the first base layer BSL1. In an embodiment of the inventive concepts, the positions of both the end portions EP2 of the first cover layer CVL1 may be variously changed within a range in which the first cover layer CVL1 can completely cover the intermediate layer CTL located on the bottom thereof.

As described above, in accordance with the embodiment of the inventive concepts, the cover layer CVL made of a conductive material is disposed over the intermediate layer CTL located in at least one region of the non-display region DD_NDA, to protect the intermediate layer CTL from subsequent processes performed after the cover layer CVL is formed, so that a failure possibility in which the intermediate layer CTL is separated from the display panel DP and touch screen TS may be reduced. Accordingly, the display device having improved reliability can be implemented.

Also, in accordance with the embodiment of the inventive concepts, a step difference of a lower structure of the intermediate layer CTL (or an upper structure of the test pad TE_PD) is reduced, and an area with which the intermediate layer CTL and a component located on the bottom of the intermediate layer CTL are in contact with each other is further secured, so that a possibility of failure in which the intermediate layer CTL is separated from the display panel DP and touch screen TS is further reduced.

Although a case where the intermediate layer CTL is disposed in at least one region of the non-display region DD_NDA has been described in the above-described embodiment, the inventive concepts are not limited thereto. In some embodiments, the intermediate layer CTL may be disposed in at least one region of the display region DD_DA. In an example, the intermediate layer CTL may be disposed in an optical opening to control the path of light incident into a sensor (not illustrated) disposed on the bottom of the display region DD_DA, e.g., one region of the display region DD_DA, in which a transmitting window is located. Therefore, the cover layer CVL may also be located in the one region of the display region DD_DA, in which the transmitting window is located.

FIGS. 13A to 13J are schematic sectional views sequentially illustrating a fabricating method of one region of the display region of the display device shown in FIG. 8 and one region of the non-display region of the display device shown in FIG. 10.

Referring to FIGS. 7 to 10 and 13A, a driving transistor Tdr and a test pad TE_PD are formed on a buffer layer BFL on a substrate SUB.

A passivation layer PSV is formed, which includes a contact hole exposing one region of the driving transistor Tdr and a first opening OP1 exposing one region of the test pad TE_PD.

A first electrode EL1 is formed on the passivation layer PSV, and a pixel defining layer PDL is formed, which includes an opening Op exposing a portion of the first electrode EL1 and a second opening OP2 exposing one region of the test pad TE_PD. A width W2 of the second opening OP2 of the pixel defining layer PDL is designed greater than that W1 of the first opening OP of the passivation layer PSV. Accordingly, both end portions of the pixel defining layer PDL are located outward of both end portions of the passivation layer PSV, and therefore, an upper structure of the test pad TE_PD may be provided in a step shape including a step difference.

An emitting layer EML is formed on the pixel defining layer PDL, and a second electrode EL2 is formed on the emitting layer EML.

The test pad TE_PD exposed by the first and second openings OP1 and OP2 may be in contact with a probe of an external testing apparatus to apply a predetermined signal to an element which becomes a target to be tested, which is located in a display region DD_DA, through a connection line, thereby determining whether a defect has occurred in the element. The test pad TE_PD may be separated from the probe after the defect determining process.

Referring to FIGS. 7 to 10, 13A, and 13B, a thin film encapsulation layer TFE is formed on a display element layer DPL including the pixel defining layer PDL and a light emitting element OLED. The thin film encapsulation layer TFE may include a first encapsulation layer ENC1, a second encapsulation layer ENC2, and a third encapsulation layer ENC3.

Subsequently, a first base layer BSL1 is formed on the thin film encapsulation layer TFE.

Referring to FIGS. 7 to 10 and 13A to 13C, an intermediate layer CTL is formed in one region of a non-display region DD_NDA. The intermediate layer CTL may be provided in a shape filling the first and second openings OP1 and OP2, and overlap with the test pad TE_PD. The intermediate layer CTL may be configured with an organic insulating layer including an organic material.

The intermediate layer CTL may compensate for a step difference of the upper structure of the test pad TE_PD, which is caused by the first and second openings OP1 and OP2.

Referring to FIGS. 7 to 10 and 13A to 13D, a second base layer BSL2 is formed on the first base layer BSL1 on which the intermediate layer CTL is formed. The second base layer BSL2 may be an inorganic insulating layer including an inorganic material. The based layer BSL2 may be provided in a shape covering the intermediate layer CTL in the non-display region DD_NDA, but the inventive concepts are not limited thereto. In some embodiments, the second base layer BSL2 may be provided in a shape covering the whole of the intermediate layer CTL and the first base layer BSL1 in the non-display region NDA.

Referring to FIGS. 7 to 10 and 13A to 13E, after a photosensitive material layer (not illustrated) is deposited on a conductive layer CL, a photosensitive pattern PRP which covers one region of the conductive layer CL and exposes the other region of the conductive layer CL to the outside is formed by performing a mask process.

In the display region DD_DA, the photosensitive pattern PRP is formed to correspond to a region in which first bridge patterns BRP1 to be formed by a subsequent process are located. In the non-display region DD_NDA, the photosensitive pattern PRP may be formed to correspond to a region in which the intermediate layer CTL is located, and protect the intermediate layer CTL located on the bottom thereof when a process of removing the conductive layer CL exposed to the outside is performed.

Referring to FIGS. 7 to 10 and 13A to 13G, the conductive layer CL exposed to the outside is removed by performing an etching process using the photosensitive pattern PRP as an etching mask.

The etching process may be a dry etching process. The photosensitive pattern PRP blocks an etching gas used when the dry etching process is performed from penetrating into the intermediate layer CTL, so that a failure in which the intermediate layer CTL may become separated from the display panel DP may be prevented.

A cover layer CVL may be provided in a shape completely covering the intermediate layer CTL, and have both end portions EP2 each spaced apart from each of both end portions EP1 of the intermediate layer CTL.

Subsequently, a first conductive pattern CP1 is formed in each of the display region DD_DA and the non-display region DD_NDA by removing the photosensitive pattern PRP. The first conductive pattern CP1 in the display region DD_DA may include the first bridge patterns BRP1, and the first conductive pattern CP1 in the non-display region DD_NDA may include the cover layer CVL and a first metal layer (MTL1 illustrated in FIG. 6C) of sensing lines SL. The cover layer CVL completely covers the intermediate layer CTL in a process of removing the photosensitive pattern PRP, so that a possibility of failure in which the intermediate layer CTL is separated from the test pad TE_PD of the display panel DP may be further prevented.

Referring to FIGS. 7 to 10 and 13A to 13H, after an inorganic insulating material layer including an inorganic material is formed on the second base layer BSL2 including the first bridge patterns BRP1 and the cover layer CVL, a first insulating layer INS1 including a contact hole exposing a portion of the first bridge patterns BRP1 is formed by performing a mask process.

Referring to FIGS. 7 to 10 and 13A to 13I, after a conductive layer (not illustrated) is formed on the first insulating layer INS1, a second conductive pattern CP2 is formed in each of the display region DD_DA and the non-display region DD_NDA by performing a mask process.

The second conductive pattern CP2 in the display region DD_DA may include first and second sensor patterns SP1 and SP2 and second bridge patterns BRP2. The second conductive pattern CP2 in the non-display region DD_NDA may include a second metal layer (see MTL2 illustrated in FIG. 6C) of each of the sensing lines SL and first and second pads PD1 and PD2.

In the non-display region DD_NDA, the cover layer CVL and the first insulating layer INS1 blocks an etching gas used when the mask process is performed from penetrating into the intermediate layer CTL, to further prevent a type of failure in which the intermediate layer CTL is separated from the display panel DP while protecting the test pad TE_PD.

Referring to FIGS. 7 to 10 and 13A to 13J, a second insulating layer INS2 covering the second conductive pattern CP2 is formed. The second insulating layer INS2 may be an organic insulating layer including an organic material.

In accordance with the inventive concepts, in the display device, a cover layer is disposed on an intermediate layer located in one region of the display panel, so that the intermediate layer is completely covered by the cover layer. Accordingly, a failure in which the intermediate layer is separated from the display panel in a fabricating process may be prevented.

Further, in accordance with the inventive concepts, there can be provided a display device having improved reliability and a fabricating method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the inventive concepts as set forth in the following claims.

What is claimed is:

1. A display device comprising:
   a substrate including a display region in which a plurality of pixels are provided and a non-display region surrounding at least one side of the display region;
   a display element layer including a light emitting element provided in each of the pixels;
   a pad provided in at least a portion of the non-display region of the substrate, the pad having a test signal supplied thereto; and
   a touch sensor disposed on the display element layer, wherein:
   the touch sensor includes:
     a base layer disposed on the display element layer;
     a first conductive pattern disposed on the base layer;
     a first insulating layer provided over the first conductive pattern;
     a second conductive pattern disposed on the first insulating layer;
     a second insulating layer provided over the second conductive pattern;
     an intermediate layer disposed on the base layer to correspond to the pad; and
     a cover layer disposed over the intermediate layer;
   the intermediate layer and the cover layer include different materials; and
   the intermediate layer is provided in a shape filling an opening exposing at least a portion of the pad.

2. The display device of claim 1, wherein the intermediate layer includes an organic insulating material, and the cover layer includes a conductive material.

3. The display device of claim 1, the intermediate layer is disposed on the display element layer to correspond to the pad.

4. The display device of claim 3, wherein the cover layer completely covers the intermediate layer.

5. The display device of claim 4, wherein each of both end portions of the intermediate layer is spaced apart from each of both end portions of the cover layer at a certain distance.

6. The display device of claim 5, wherein each of both the end portions of the intermediate layer is located inward of each of both the end portions of the cover layer.

7. The display device of claim 4, wherein:
   the first conductive pattern includes a plurality of first bridge patterns disposed on the base layer;
   the second conductive pattern includes:
     a plurality of first sensor patterns disposed on the first insulating layer, the plurality of first sensor patterns extending in a first direction and being connected to each other by the plurality of first bridge patterns;
     a plurality of second sensor patterns disposed on the first insulating layer, the plurality of second sensor patterns extending in a second direction different from the first direction, the plurality of second sensor patterns being spaced apart from the first sensor patterns; and
     a plurality of second bridge patterns connecting the second sensor patterns.

8. The display device of claim 7, wherein the cover layer is provided on the same layer as the first bridge patterns and includes the same material as the first bridge patterns.

9. The display device of claim 7, wherein the cover layer includes:
   a first cover layer provided in the same layer as the first bridge patterns, the first cover layer including the same material as the first bridge patterns; and
   a second cover layer provided in the same layer as the first and second sensor patterns and the second bridge patterns, the second cover layer including the same material as the first and second sensor patterns and the second bridge patterns.

10. The display device of claim 7, further comprising a pixel circuit layer disposed between the substrate and the display element layer.

11. The display device of claim 10, wherein the pixel circuit layer includes at least one transistor disposed on the substrate and a passivation layer covering the transistor, wherein the display element layer further includes a pixel defining layer disposed on the passivation layer, the pixel defining layer defining an emission region of each of the pixels.

12. The display device of claim 11, wherein the opening includes:
   a first opening penetrating the passivation layer in the non-display region and exposing the pad; and
   a second opening penetrating the pixel defining layer in the non-display region and exposing the pad,
   wherein a width of the first opening and a width of the second opening are different from each other.

13. The display device of claim 12, wherein, when viewed on a section, both side surfaces of the first opening are located inward of both side surfaces of the second opening.

14. The display device of claim 13, wherein the intermediate layer is provided in a shape filling the first and second openings.

15. A method of fabricating a display device, the method comprising:
   providing a substrate including a display region and a non-display region;
   forming a plurality of transistors in the display region, and forming a pad having a test signal supplied thereto in at least a portion of the non-display region;
   forming a passivation layer over the transistors and the pad, the passivation layer including a first opening exposing at least a portion of the pad;

forming a display element layer including a pixel defining layer and light emitting elements on the passivation layer, the pixel defining layer including a second opening exposing at least a portion of the pad; and forming a touch sensor on the display element layer, wherein:

the forming of the touch sensor includes:
- forming a base layer on the display element layer;
- forming an intermediate layer on the base layer to correspond to the pad;
- forming first bridge patterns on the base layer corresponding to the display region, and forming a cover layer over the intermediate layer;
- forming a first insulating layer over the first bridge patterns and the cover layer;
  - forming a plurality of first sensor patterns, a plurality of second sensor patterns, and a plurality of second bridge patterns on the first insulating layer corresponding to the display region; and
- forming a second insulating layer over the first sensor patterns, the second sensor patterns, and the second bridge patterns;

the cover layer is provided in a shape completely covering the intermediate layer; and the intermediate layer is provided in a shape filling the first and second openings.

16. The method of claim 15, wherein the intermediate layer includes an organic insulating material, and the cover layer includes a conductive material.

17. The method of claim 16, wherein the forming of the cover layer includes:
- forming a conductive layer on the intermediate layer;
- forming, on the conductive layer, a photosensitive pattern including an opening exposing one region of the conductive layer;
- removing the exposed region of the conductive layer by performing an etching process, using the photosensitive pattern as a mask; and
- removing the photosensitive pattern.

18. The method of claim 17, wherein each of both end portions of the intermediate layer is spaced apart from each of both end portions of the cover layer at a certain distance.

19. The method of claim 18, wherein each of both the end portions of the intermediate layer is located inward of the each of both the end portions of the cover layer.

* * * * *